United States Patent
Mori et al.

(10) Patent No.: US 10,811,610 B2
(45) Date of Patent: Oct. 20, 2020

(54) COMPOSITION AND LIGHT EMITTING DEVICE OBTAINED BY USING THE COMPOSITION

(71) Applicant: Sumitomo Chemical Company, Limited, Tokyo (JP)

(72) Inventors: Takuya Mori, Osaka (JP); Hiroyuki Hayasaka, Osaka (JP); Hidenobu Kakimoto, Osaka (JP); Toshihiro Hodai, Osaka (JP)

(73) Assignee: Sumitomo Chemical Company, Limited, Tokyo (JP)

(*) Notice: Subject to any disclaimer, the term of this patent is extended or adjusted under 35 U.S.C. 154(b) by 0 days.

(21) Appl. No.: 16/480,413

(22) PCT Filed: Jan. 23, 2018

(86) PCT No.: PCT/JP2018/001940
§ 371 (c)(1),
(2) Date: Jul. 24, 2019

(87) PCT Pub. No.: WO2018/139441
PCT Pub. Date: Aug. 2, 2018

(65) Prior Publication Data
US 2019/0386223 A1  Dec. 19, 2019

(30) Foreign Application Priority Data

Jan. 27, 2017 (JP) .................. 2017-012843

(51) Int. Cl.
*H01L 51/00* (2006.01)
*C08G 61/12* (2006.01)
(Continued)

(52) U.S. Cl.
CPC ........ *H01L 51/0043* (2013.01); *C08G 61/122* (2013.01); *C09K 11/06* (2013.01);
(Continued)

(58) Field of Classification Search
CPC ....................................................... C08J 3/093
(Continued)

(56) References Cited

U.S. PATENT DOCUMENTS 5,498,657 A * 3/1996 Sugiyama ............ C08J 3/093
                                                    428/421
2010/0267180 A1  10/2010 Kojima et al.
(Continued)

FOREIGN PATENT DOCUMENTS

JP  S60054931 A  3/1985
JP  S62042893 A  2/1987
(Continued)

OTHER PUBLICATIONS

International Search Report dated Apr. 3, 2018 in International Application No. PCT/JP2018/001940.
(Continued)

*Primary Examiner* — Khanh T Nguyen
(74) *Attorney, Agent, or Firm* — Panitch Schwarze Belisario & Nadel LLP

(57) ABSTRACT

A composition which is useful for producing a light emitting device having excellent luminance life is provided. The composition contains a primary fluorinated alcohol represented by the formula (1), a secondary fluorinated alcohol represented by the formula (1') and an electron injectable compound or an electron transportable compound, wherein the content of the secondary fluorinated alcohol is 0.01% by mass to 0.75% by mass with respect to the total content of the primary fluorinated alcohol and the secondary fluorinated alcohol:

$$C_nH_{2n-m+1}F_mOH \quad (1)$$

$$C_nH_{2n'-m'+1}F_{m'}OH \quad (1')$$

(Continued)

In the formula (1), n represents an integer of 1 to 10, and m is an integer satisfying $1 \leq m \leq 2n+1$. In the formula (1'), n' represents an integer of 3 to 10, and m' is an integer satisfying $1 \leq m' \leq 2n'+1$.

7 Claims, 1 Drawing Sheet

(51) Int. Cl.
    *C09K 11/06*     (2006.01)
    *H01L 51/50*     (2006.01)

(52) U.S. Cl.
    CPC ...... *H01L 51/0039* (2013.01); *H01L 51/0072* (2013.01); *H01L 51/0074* (2013.01); *H01L 51/0085* (2013.01); *C08G 2261/124* (2013.01); *C08G 2261/148* (2013.01); *C08G 2261/1412* (2013.01); *C08G 2261/18* (2013.01); *C08G 2261/228* (2013.01); *C08G 2261/312* (2013.01); *C08G 2261/3142* (2013.01); *C08G 2261/3162* (2013.01); *C08G 2261/3221* (2013.01); *C08G 2261/514* (2013.01); *C08G 2261/95* (2013.01); *C09K 2211/1029* (2013.01); *C09K 2211/1044* (2013.01); *C09K 2211/185* (2013.01); *H01L 51/5016* (2013.01); *H01L 51/5072* (2013.01); *H01L 51/5092* (2013.01)

(58) Field of Classification Search
    USPC ........................................................ 428/421
    See application file for complete search history.

(56) References Cited

U.S. PATENT DOCUMENTS

| | | |
|---|---|---|
| 2016/0181531 A1 | 6/2016 | Terui et al. |
| 2019/0048131 A1 | 2/2019 | Iijima et al. |

FOREIGN PATENT DOCUMENTS

| | | |
|---|---|---|
| JP | 2010192369 A | 9/2010 |
| JP | 2015038976 A | 2/2015 |
| JP | 2017183409 A | 10/2017 |
| WO | 2009063850 A1 | 5/2009 |
| WO | 2012063656 A1 | 5/2012 |

OTHER PUBLICATIONS

Written Opinion dated Apr. 3, 2018 in International Application No. PCT/JP2018/001940.

\* cited by examiner

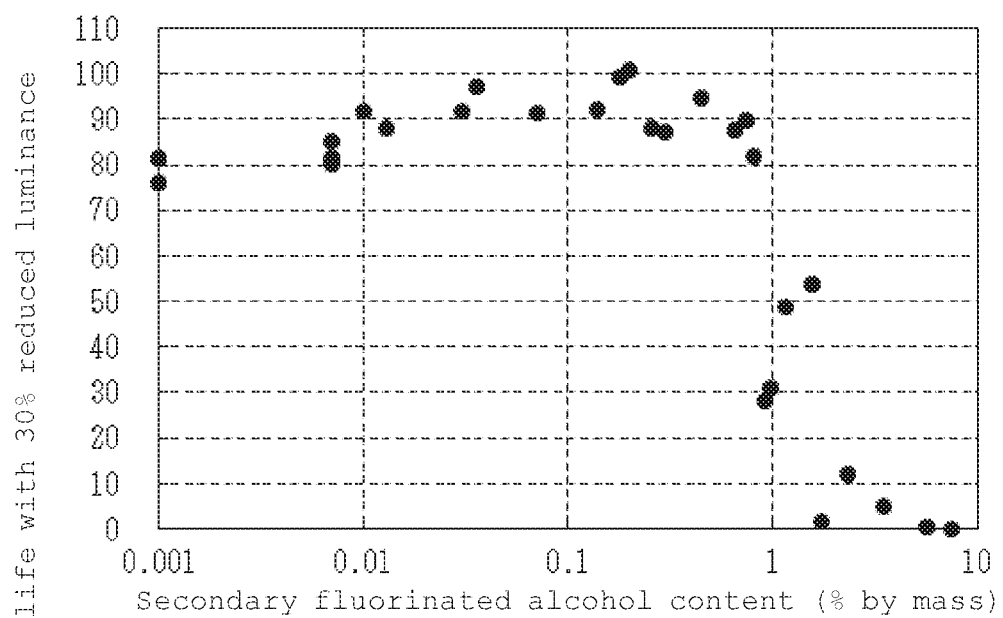

COMPOSITION AND LIGHT EMITTING DEVICE OBTAINED BY USING THE COMPOSITION

CROSS-REFERENCE TO RELATED APPLICATIONS

This application is a Section 371 of International Application No. PCT/JP2018/001940, filed Jan. 23, 2018, which was published in the Japanese language on Aug. 2, 2018, under International Publication No. WO 2018/139441 A1, which claims priority under 35 U.S.C. § 119(b) to Japanese Application No. 2017-012843, filed Jan. 27, 2017, the disclosures of which are incorporated herein by reference in their entirety.

TECHNICAL FIELD

The present invention relates to a composition and a light emitting device obtained by using the composition.

PRIOR ART

In order to improve the properties of a light emitting device such as an organic electroluminescent device and the like, studies are being made to insert various layers between a light emitting layer and an electrode. For example, a method is known in which an electron transporting layer formed by using a solution in which an electron transporting material is dissolved in a single fluorinated alcohol is inserted between a light emitting layer and an electrode (Patent Document 1).

PRIOR ART DOCUMENT

Patent Document

Patent Document 1: International Publication WO2009/063850

SUMMARY OF THE INVENTION

Problem to be Solved by the Invention

However, when a single fluorinated alcohol is used as an applying solvent for an electron transport material, the luminance life of the resulting light emitting device is not necessarily sufficient.

Then, the present invention has an object of providing a composition which is useful for production of a light emitting device excellent in luminance life and a light emitting device obtained by using the composition.

Means for Solving the Problem

The present invention provides the following [1] to [7].

[1] A composition comprising a primary fluorinated alcohol represented by the formula (1), a secondary fluorinated alcohol represented by the formula (1') and an electron injectable compound or an electron transportable compound, wherein the content of the secondary fluorinated alcohol is 0.01% by mass to 0.75% by mass with respect to the total content of the primary fluorinated alcohol and the secondary fluorinated alcohol:

$$C_nH_{2n-m+1}F_mOH \quad (1)$$

$$C_nH_{2n'-m'+1}F_{m'}OH \quad (1')$$

[In the formula (1),
n represents an integer of 1 to 10, and m is an integer satisfying $1 \leq m \leq 2n+1$.
In the formula. (1'),
n' represents an integer of 3 to 10, and m' is an integer satisfying $1 \leq m' \leq 2n'+1$.].

[2] The composition according to [1], wherein the above-described n and the above-described n' are each an integer of 4 to 8.

[3] The composition according to [1] or [2], wherein the above-described m is an integer satisfying $m=2n-2$ and the above-described m' is an integer satisfying $m'=2n'-2$.

[4] The composition according to any one of [1] to [3], wherein the above-described n and the above-described n' are the same integer and the above-described m and the above-described m' are the same integer.

[5] The composition according to any one of [1] to [4], wherein the above-described electron injectable compound or the above-described electron transportable compound has a group represented by any of the formula (2) to the formula (4):

$$-COO^-M^+ \quad (2)$$

$$-SO_3^-M^+ \quad (3)$$

$$PO_3^{2-}M^+ \quad (4)$$

[In the formulae (2) to (4),
$M^+$ represents an alkali metal cation, an alkaline earth metal cation or an ammonium cation, and the ammonium cation optionally has a substituent.].

[6] The composition according to [5], wherein the above-described electron injectable compound or the above-described electron transportable compound has a constitutional unit represented by the formula (5):

[Chemical Formula 1]

$$\begin{array}{c}(R_i)_{ni}\\|\\-\!\!+\!\!Ar\!\!+\!\!-\end{array} \quad (5)$$

[In the formula (5),
ni represents an integer of 1 to 4.
Ar represents an aromatic hydrocarbon group or a heterocyclic group, and these groups optionally have a substituent other than Ri. When a plurality of the substituent other than Ri are present, they may be the same or different.
$R_i$ represents a group represented by the formula (I-1). When a plurality of $R_i$ are present, they may be the same or different.]

$$-R-\{(Q)_{n1}-Y\}_{n2} \quad (I-1)$$

[In the formula (I-1),
n1 represents an integer of 0 to 4. When a plurality of n1 are present, they may be the same or different.
n2 represents an integer of 1 to 4.
When n2=1, R represents a single bond, a hydrocarbon group, a heterocyclic group or —O—R'— (R' represents a hydrocarbon group or a heterocyclic group), and these groups optionally have a substituent, while when $2 \leq n2 \leq 4$, R represents a hydrocarbon group or a heterocyclic group, and these groups optionally have a substituent.
Q represents an alkylene group, a cycloalkylene group, an arylene group, an oxygen atom or a sulfur atom, and these groups optionally have a substituent. When a plurality of Q are present, they may be the same or different.

Y represents a group represented by any of the above-described formula (2) to the above-described formula (4). When a plurality of Y are present, they may be the same or different.]

[7] A light emitting device obtained by using the composition according to any one of [1] to [6].

Effect of the Invention

According to the present invention, a composition which is useful for production of a light emitting device excellent in luminance life and a light emitting device obtained by using the composition can be provided.

BRIEF EXPLANATION OF DRAWING

FIG. 1 is a graph showing the correlation between the content of a secondary fluorinated alcohol in compositions used in Examples and Comparative Examples and the life with 30% reduced luminance of a light emitting device by a single logarithmic plot.

MODES FOR CARRYING OUT THE INVENTION

Suitable embodiments of the present invention will be illustrated in detail below.
<Explanation of Common Terms>
Terms commonly used in the present specification have the following meanings unless otherwise stated.

Me represents a methyl group, Et represents an ethyl group, Bu represents a butyl group, i-Pr represents an isopropyl group and t-Bu represents a tert-butyl group.

The hydrogen atom may be a heavy hydrogen atom or a light hydrogen atom.

In the formula representing a metal complex, the solid line representing a bond to the central metal means a covalent bond or a coordinate bond.

The "polymer compound" denotes a polymer having molecular weight distribution and having a polystyrene-equivalent number-average molecular weight of $1 \times 10^3$ to $1 \times 10^8$.

The polymer compound may be any of a block copolymer, a random copolymer, an alternating copolymer or a graft copolymer, and may also take another form.

The end group of a polymer compound is preferably a stable group since if the polymerization active group is left as it is, the light emission characteristics or the luminance life may be reduced when the polymer compound is used for fabrication of a light emitting device. The end group of a polymer compound is preferably a group conjugated with the main chain, and for example, an aryl group or a monovalent heterocyclic group bonded to the main chain of a polymer compound via a carbon-carbon bond is mentioned.

The "low molecular compound" denotes a compound having no molecular weight distribution and having a molecular weight of $1 \times 10^4$ or less.

The "constitutional unit" denotes one or more units present in a polymer compound.

The "alkyl group" may be any of linear or branched. The number of carbon atoms of the linear alkyl group is, not including the number of carbon atoms of the substituent, for example 1 to 50, preferably 3 to 30, more preferably 4 to 20. The number of carbon atoms of the branched alkyl group is, not including the number of carbon atoms of the substituent, for example 3 to 50, preferably 3 to 30, more preferably 4 to 20.

The alkyl group optionally has a substituent and includes, for example a methyl group, an ethyl group, a propyl group, an isopropyl group, a butyl group, a 2-butyl group, as isobutyl group, a tert-butyl group, a pentyl group, an isoamyl group, a 2-ethylbutyl group, a hexyl group, a heptyl group, an octyl group, a 2-ethylhexyl group, a 3-propylheptyl group, a decyl group, a 3,7-dimethyloctyl group, a 2-ethyloctyl group, a 2-hexyldecyl group and a dodecyl group, and groups obtained by substituting a hydrogen atom of these groups with a cycloalkyl group, an alkoxy group, a cycloalkoxy group, an aryl group, a fluorine atom and the like (for example, a trifluoromethyl group, a pentafluoroethyl group, a perfluorobutyl group, a perfluorohexyl group, a perfluorooctyl group, a 3-phenylpropyl group, a 3-(4-methylphenyl)propyl group, a 3-(3,5-di-hexylphenyl)propyl group and a 6-ethyloxyhexyl group).

The number of carbon atoms of the "cycloalkyl group" is, not including the number of carbon atoms of the substituent, for example 3 to 50, preferably 3 to 30, more preferably 4 to 20.

The cycloalkyl group optionally has a substituent and includes, for example, a cyclohexyl group, a cyclohexylmethyl group and a cyclohexylethyl group.

The "aryl group" denotes an atomic group remaining after removing from an aromatic hydrocarbon one hydrogen atom bonding directly to a carbon atom constituting the ring. The number of carbon atoms of the aryl group is, not including the number of carbon atoms of the substituent, for example 6 to 60, preferably 6 to 20, more preferably 6 to 10.

The aryl group optionally has a substituent and includes, for example, a phenyl group, a 1-naphthyl group, a 2-naphthyl group, a 1-anthracenyl group, a 2-anthracenyl group, a 9-anthracenyl group, a 1-pyrenyl group, 2a-pyrenyl group, a 4-pyrenyl group, a 2-fluorenyl group, a 3-fluorenyl group, a 4-fluorenyl group, a 2-phenylphenyl group, a 3-phenylphenyl group and a 4-phenylphenyl group, and groups obtained by substituting a hydrogen atom in these groups with an alkyl group, a cycloalkyl group, an alkoxy group, a cycloalkoxy group, an aryl group, a fluorine atom and the like.

The "alkoxy group" may be any of linear or branched. The number of carbon atoms of the linear alkoxy group is, not including the number of carbon atoms of the substituent, for example 1 to 40, preferably 4 to 10. The number of carbon atoms of the branched alkoxy group is, not including the number of carbon atoms of the substituent, for example 3 to 40, preferably 4 to 10.

The alkoxy group optionally has a substituent and includes, for example, a methoxy group, an ethoxy group, a propyloxy group, an isopropyloxy group, a butyloxy group, an isobutyloxy group, a tert-butyloxy group, a pentyloxy group, a hexyloxy group, a heptyloxy group, an octyloxy group, a 2-ethylhexyloxy group, a nonyloxy group, a decyloxy group, a 3,7-dimethyloctyloxy group and a lauryloxy group, and groups obtained by substituting a hydrogen atom of these groups with a cycloalkyl group, an alkoxy group, a cycloalkoxy group, an aryl group, a fluorine atom and the like.

The number of carbon atoms of the "cycloalkoxy group" is, not including the number of carbon atoms of the substituent, for example 3 to 40, preferably 4 to 10.

The cycloalkoxy group optionally has a substituent and includes, for example, a cyclohexyloxy group.

The number of carbon atoms of the "aryloxy group" is, not including the number of carbon atoms of the substituent, for example 6 to 60, preferably 6 to 48.

The aryloxy group optionally has a substituent and includes, for example, a phenoxy group, a 1-naphthyloxy group, a 2-naphthyloxy group, a 1-anthracenyloxy group, 9a-anthracenyloxy group and a 1-pyrenyloxy group, and groups obtained by substituting a hydrogen atom of these groups with an alkyl group, a cycloalkyl group, an alkoxy group, a cycloalkoxy group, a fluorine atom and the like.

The "p-valent heterocyclic group" (p represents an integer of 1 or more) denotes an atomic group remaining after removing p hydrogen atoms among hydrogen atoms bonding directly to carbon atoms or hetero atoms constituting the ring. Of p-valent heterocyclic groups, preferable are "p-valent aromatic heterocyclic groups" which are atomic groups remaining after removing p-hydrogen atoms among hydrogen atoms bonding directly to carbon atoms or hetero atoms constituting the ring.

The "aromatic heterocyclic compound" denotes a compound in which the hetero ring itself shows aromaticity such as oxadiazole, thiadiazole, thiazole, oxazole, thiophene, pyrrole, phosphole, furan, pyridine, pyrazine, pyrimidine, triazine, pyridazine, quinoline, isoquinoline, azole, diazole, triazole, carbazole, azacarbazole, diazacarbazole, dibenzophosphole and the like, and a compound in which the aromatic ring is condensed to the hetero ring even if the hetero ring itself shows no aromaticity such as phenoxazine, phenothiazine, dibenzoborole, dibenzosilole, benzopyran and the like.

The number of carbon atoms of the monovalent heterocyclic group is, not including the number of carbon atoms of the substituent, for example 2 to 60, preferably 4 to 20.

The monovalent heterocyclic group optionally has a substituent and includes, for example, a thienyl group, a pyrrolyl group, a furyl group, a pyridyl group, a piperidinyl group, a quinolinyl group, an isoquinolinyl group, a pyrimidinyl group and a triazinyl group, and groups obtained by substituting a hydrogen atom in these groups with an alkyl group, a cycloalkyl group, an alkoxy group, a cycloalkoxy group and the like.

The "halogen atom" denotes a fluorine atom, a chlorine atom, a bromine atom or an iodine atom.

The "amino group" optionally has a substituent, and the substituted amino group is preferred. The substituent which the amino group has is preferably an alkyl group, a cycloalkyl group, an aryl group or a monovalent heterocyclic group.

The substituted amino group includes, for example, a dialkylamino group, a dicycloalkylamino group and a diarylamino group.

The amino group includes, for example, a dimethylamino group, a diethylamino group, a diphenylamino group, a bis(4-methylphenyl)amino group, a bis(4-tert-butylphenyl) amino group and a bis(3,5-di-tert-butylphenyl)amino group.

The "alkenyl group" may be any of linear or branched. The number of carbon atoms of the linear alkenyl group is, not including the number of carbon atoms of the substituent, for example 2 to 30, preferably 3 to 20. The number of carbon atoms of the branched alkenyl group is, not including the number of carbon atoms of the substituent, for example 3 to 30, preferably 4 to 20.

The number of carbon atoms of the "cycloalkenyi group" is, not including the number of carbon atoms of the substituent, for example 3 to 30, preferably 4 to 20.

The alkenyl group and the cycloalkenyl group optionally have a substituent and include, for example, a vinyl group, a 1-propenyl group, a 2-propenyl group, a 2-butenyl group, a 3-butenyl group, a 3-pentenyl group, a 4-pentenyl group, a 1-hexenyl group, a 5-hexenyl group and a 7-octenyl group, and these groups having a substituent.

The "alkynyl group" may be any of linear or branched. The number of carbon atoms of the alkynyl group is, not including the number of carbon atoms of the substituent, for example 2 to 20, preferably 3 to 20. The number of carbon atoms of the branched alkynyl group is, not including the number of carbon atoms of the substituent, for example 4 to 30, preferably 4 to 20.

The number of carbon atoms of the "cycloalkynyl group" is, not including the number of carbon atoms of the substituent, for example 4 to 30, preferably 4 to 20.

The alkynyl group and the cycloalkynyl group optionally have a substituent and include, for example, an ethynyl group, a 1-propynyl group, a 2-propynyl group, a 2-butynyl group, a 3-butynyl group, a 3-pentynyl group, a 4-pentynyl group, a 1-hexynyl group and a 5-hexynyl group, and these groups having a substituent.

The "arylene group" denotes an atomic group remaining after removing from an aromatic hydrocarbon two hydrogen atoms bonding directly to carbon atoms constituting the ring. The number of carbon atoms of the arylene group is, not including the number of carbon atoms of the substituent, for example 6 to 60, preferably 6 to 30, more preferably 6 to 18.

The arylene group optionally has a substituent and includes, for example, a phenylene group, a naphthalenediyl group, an anthracenediyl group, a phenanthrenediyl group, a dihydrophenanthrenediyl group, a naphthacenediyl group, a fluorenediyl group, a pyrenediyl group, a perylenediyl group and a chrysenediyl group, and these groups having a substituent, and preferable are groups represented by the formula (A-1) to the formula (A-20). The arylene group includes groups obtained by bonding a plurality of these groups.

[Chemical Formula 2]

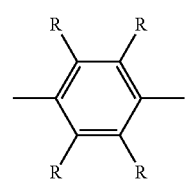

(A-1)

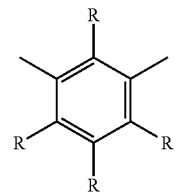

(A-2)

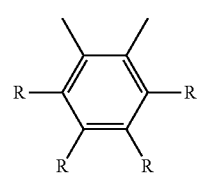

(A-3)

-continued
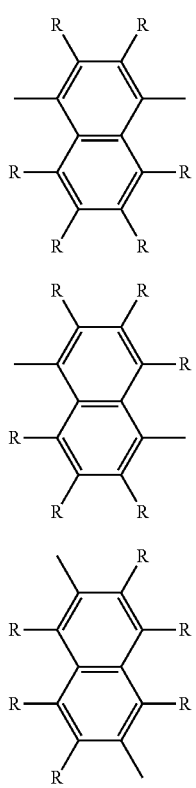
(A-4)
(A-5)
(A-6)
[Chemical Formula 3]
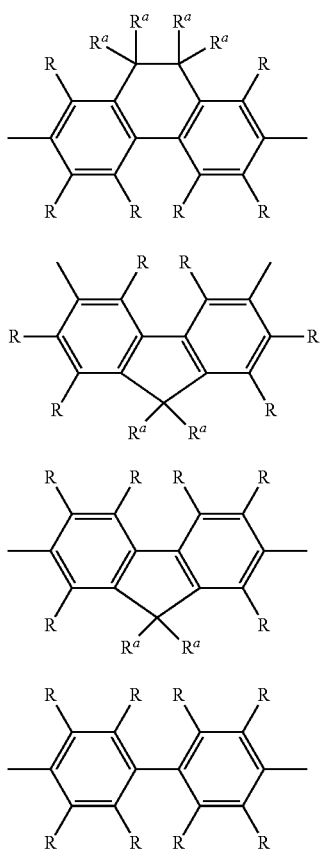
(A-7)
(A-8)
(A-9)
(A-10)
[Chemical Formula 4]
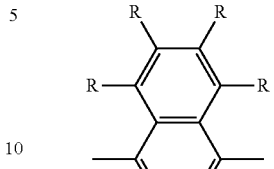
(A-11)
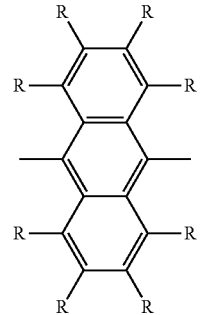
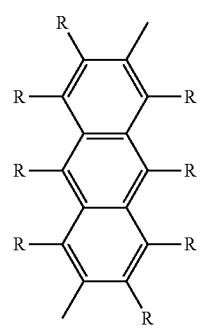
(A-12)
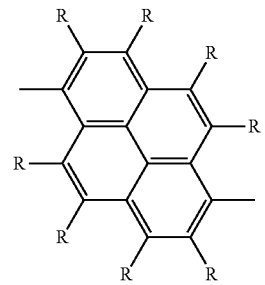
(A-13)
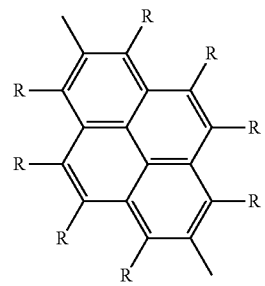
(A-14)
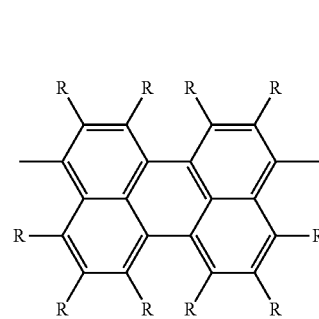
(A-15)
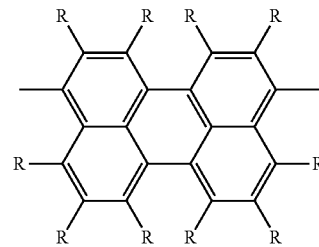

-continued

[Chemical Formula 5]

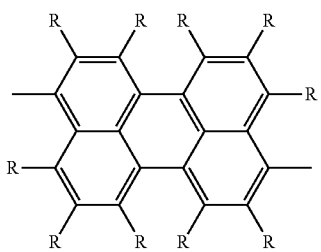
(A-16)

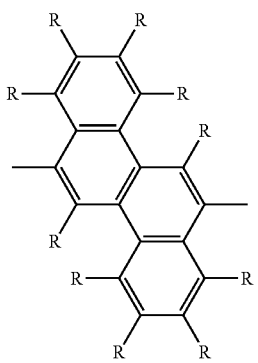
(A-17)

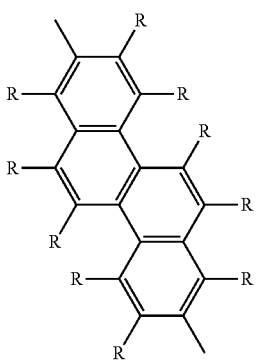
(A-18)

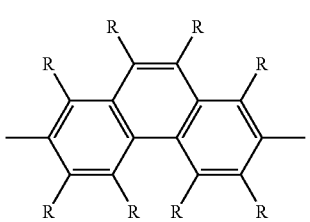
(A-19)

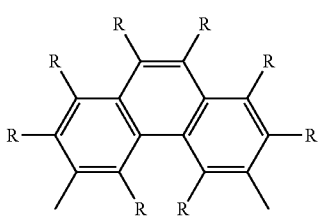
(A-20)

[wherein, R and $R^a$ each independently represent a hydrogen atom, an alkyl group, a cycloalkyl group, an aryl group or a monovalent heterocyclic group. A plurality of R and $R^a$ each may be the same or different, and groups $R^a$ may be combined together to form a ring together with atoms to which they are attached.]

The number of carbon atoms of the divalent heterocyclic group is, not including the number of carbon atoms of the substituent, for example 2 to 60, preferably 3 to 20, more preferably 4 to 15.

The divalent heterocyclic group optionally has a substituent and includes divalent groups obtained by removing from, for example, pyridine, diazabenzene, triazine, azanaphthalene, diazanaphthalene, carbazole, azacarbazole, diazacarbazole, dibenzofuran, dibenzothiophene, dibenzosilole, phenoxazine, phenothiazine, acridine, dihydroacridine, furan, thiophene, azole, diazole and triazole two hydrogen atoms among hydrogen atoms bonding directly to carbon atoms or hetero atoms constituting the ring, and preferably, groups represented by the formula (AA-1) to the formula (AA-38). The divalent heterocyclic group includes groups obtained by bonding a plurality of these group.

[Chemical Formula 6]

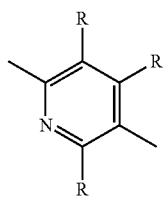
(AA-1)

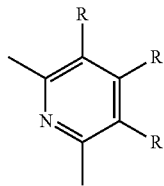
(AA-2)

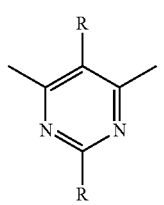
(AA-3)

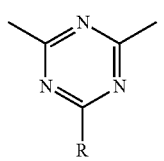
(AA-4)

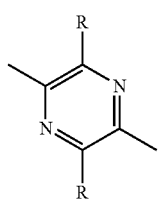
(AA-5)

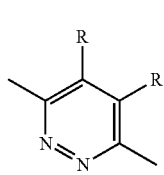
(AA-6)

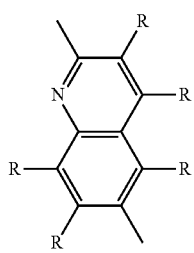 (AA-7)
[Chemical Formula 7]
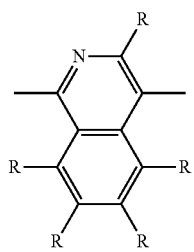 (AA-8)
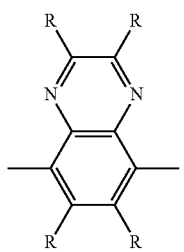 (AA-9)
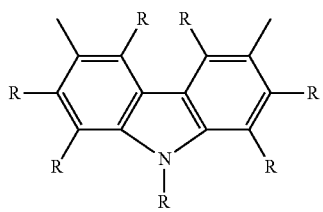 (AA-10)
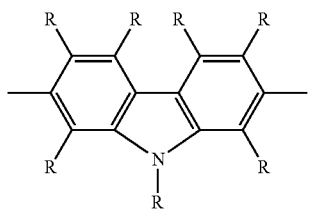 (AA-11)
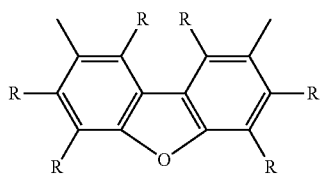 (AA-12)
[Chemical Formula 8]
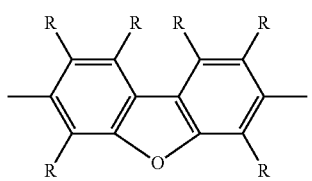 (AA-13)
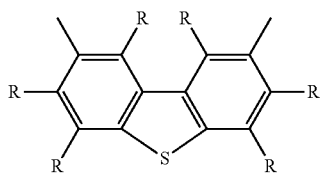 (AA-14)
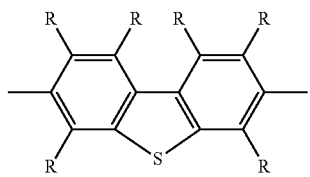 (AA-15)
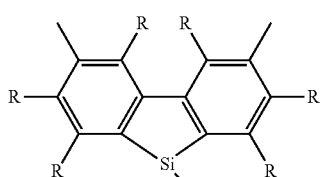 (AA-16)
[Chemical Formula 9]
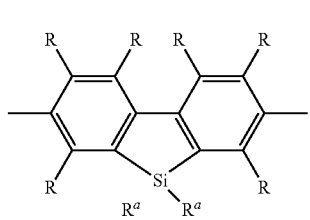 (AA-17)
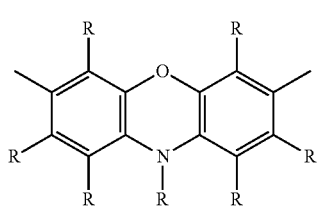 (AA-18)
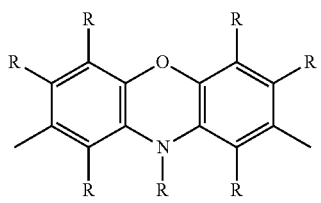 (AA-19)
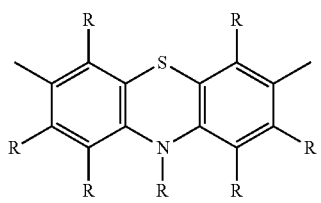 (AA-20)

[Chemical Formula 10]
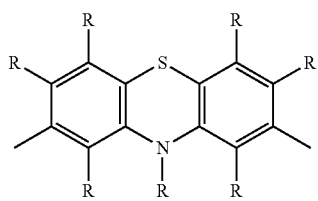
(AA-21)
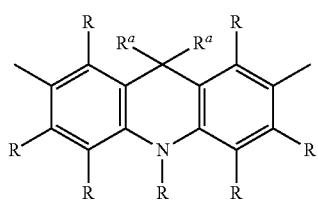
(AA-22)
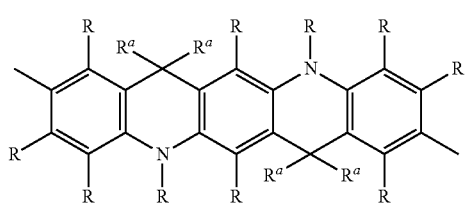
(AA-23)
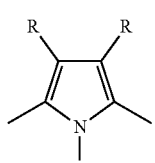
(AA-24)
[Chemical Formula 11]
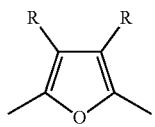
(AA-25)
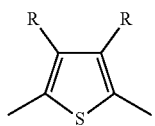
(AA-26)
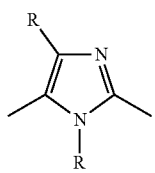
(AA-27)
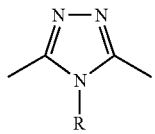
(AA-28)
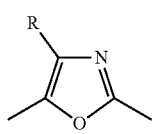
(AA-29)
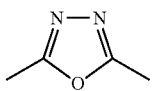
(AA-30)
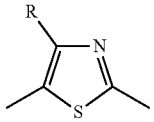
(AA-31)
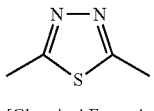
(AA-32)
[Chemical Formula 12]
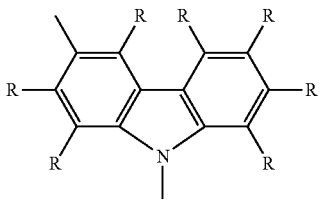
(AA-33)
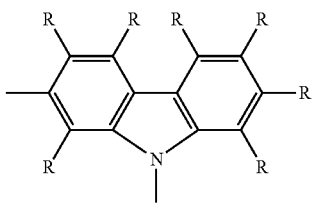
(AA-34)
[Chemical Formula 13]
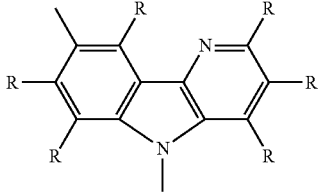
(AA-35)
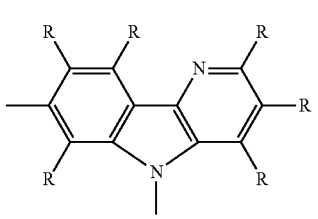
(AA-36)
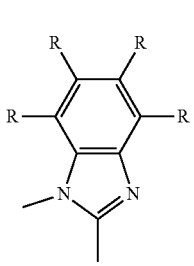
(AA-37)

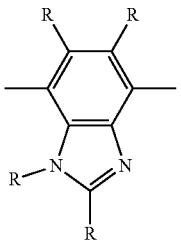

(AA-38)

[wherein, R and $R^a$ represent the same meaning as described above.]

The "crosslinking group" is a group capable of generating a new bond by being subjected to heating, ultraviolet irradiation, near ultraviolet irradiation, visible right irradiation, infrared irradiation, radical reaction and the like.

The "substituent" represents a halogen atom, a cyano group, an alkyl group, a cycloalkyl group, an aryl group, a monovalent heterocyclic group, an alkoxy group, a cycloalkoxy group, an aryloxy group, an amino group, a substituted amino group, an alkenyl group, a cycloalkenyl group, an alkynyl group or a cycloalkynyl group. The substituent may also be a crosslinking group.

<Composition>

[Primary Fluorinated Alcohol]

In the formula (1), n is preferably an integer of 3 to 10, more preferably an integer of 4 to 10, further preferably an integer of 4 to 8, particularly preferably an integer of 5 to 7, since the composition of the present embodiment is excellent in film formability.

In the formula (1), m is usually an integer of 1 to 21, and since the composition of the present embodiment is excellent in film formability, preferably an integer of 1 to 20, more preferably an integer of 4 to 20, further preferably an integer of 4 to 16.

n and m are preferably integers satisfying 2n−9≤m≤2n−1, more preferably integers satisfying 2n−5≤m≤2n−1, further preferably integers satisfying 2n−5≤m≤2n−2, particularly preferably integers satisfying m=2n−2.

The primary fluorinated alcohol may have a linear structure or a branched structure.

The primary fluorinated alcohol represented by the formula (1) is preferably a primary fluorinated alcohol represented by the formula (6).

$$C_{n-1}H_{2n-m1-1}F_{m1}\text{—}CH_2OH \tag{6}$$

[In the formula. (6), n represents the same meaning as described above, and m1 is an integer satisfying 1≤m1≤2n−1.]

m1 is usually an integer of 1 to 19, and since the composition of the present embodiment is excellent in film formability, preferably an integer of 4 to 19, more preferably an integer of 4 to 16.

n and m1 are preferably integers satisfying 2n−7≤m1≤2n−1, more preferably integers satisfying 2n−3≤m1≤2n−1, further preferably integers satisfying 2n−3≤m1≤2n−2, particularly more preferably integers satisfying m1=2n−2.

The primary fluorinated alcohol represented by the formula (1) includes, for example, trifluoromethanol, 1,1,2,2,2-pentafluoroethanol, 1H,1H-trifluoroethanol, 1H,1H-pentafluoro-1-propanol, 6-(perfluoroethyl)hexanol, 1H,1H-pentafluoro-1-butanol, 2-(perfluorobutyl)ethanol, 3-(perfluorobutyl)propanol, 6-(perfluorobutyl)hexanol, 6-(perfluoro-1-methylethyl)hexanol, 1H,1H,3H-tetrafluoro-1-propanol, 1H,1H,5H-octafluoro-1-pentanol, 1H-1H,7H-decafluoro-1-heptanol and 1H,1H,4H-hexafluoro-1-butanol.

The primary fluorinated alcohol may be a commercially available product or one synthesized. The synthesis method of the primary fluorinated alcohol includes, for example, a method described in Japanese Examined Patent Publication No. 62-42893. The primary fluorinated alcohol is preferably rectified before preparation of the composition of the present embodiment.

The primary fluorinated alcohol may be used alone or in combination of two or more.

[Secondary Fluorinated Alcohol]

In the formula (1'), n' is preferably an integer of 4 to 10, more preferably an integer of 4 to 8, further preferably an integer of 5 to 7, since the composition of the present embodiment is excellent in film formability.

In the formula (1'), m' is usually an integer of 1 to 21, and since the composition of the present embodiment is excellent in film formability, preferably an integer of 1 to 20, more preferably an integer of 4 to 20, further preferably an integer of 4 to 16.

n' and m' are preferably integers satisfying 2n'−9≤m'≤2n', more preferably integers satisfying 2n'−9≤m'≤2n'−1, further preferably integers satisfying 2n'−5≤m'≤2n'−1, particularly preferably integers satisfying 2n'−5≤m'≤2n'−2, especially preferably integers satisfying m'=2n'−2.

The secondary fluorinated alcohol represented by the formula (1') is preferably a secondary fluorinated alcohol represented by the formula (7).

$$C_{na}H_{2na-ma+1}F_{ma}\text{—}C(H)(OH)\text{—}C_{nb}H_{2nb-mb+1}F_{mb} \tag{7}$$

[In the Formula (7), na and nb are each independently an integer of 1 to 8, and satisfy 2≤na+nb≤9.

ma is an integer satisfying ma≤2na+1, and mb is an integer satisfying mb≤2nb+1.]

na and nb are preferably integers satisfying 3≤na+nb≤9, more preferably integers satisfying 3≤na+nb≤7, since the composition of the present embodiment is excellent in film formability.

ma and mb are usually integers satisfying 2≤ma+mb≤20, and since the composition of the present embodiment is excellent in film formability, preferably integers satisfying 4≤ma+mb≤20, more preferably integers satisfying 4≤ma+mb≤16.

na, nb, ma and mb are preferably integers satisfying 2na+2nb−7≤ma+mb≤2na+2nb+2, more preferably integers satisfying 2na+2nb−7≤2na+2nb+1, further preferably integers satisfying 2na+2nb−3≤ma+mb≤2na+2nb+1, particularly preferably integers satisfying 2na+2nb−3≤ma+mb≤2na+2nb, especially preferably integers satisfying ma+mb=2na+2nb.

The secondary fluorinated alcohol represented by the formula (1') includes, for example, 1,1,1,2,3,3,3-pentafluoro-2-propanol, 1,1,1,2,3,3,4,4,4-nonafluoro-2-butanol, 2H-hexafluoro-2-propanol, 4,4,4-trifluoro-2-butanol, 1H,3H,5H-octafluoro-3-pentanol and 1H,3H,7H-decafluoro-3-heptanol.

The secondary fluorinated alcohol may be a commercially available product or one synthesized. The synthesis method of the secondary fluorinated alcohol includes, for example, a method described in Japanese Examined Patent Publication No. 60-54931. The secondary fluorinated alcohol is preferably rectified before preparation of the composition of the present embodiment.

The secondary fluorinated alcohol may be used alone or in combination of two or more.

Correlation between primary fluorinated alcohol and secondary fluorinated alcohol.

It is preferable that n in the formula (1) and n' in the formula (1') are the same integer, since the composition of the present embodiment is excellent in film formability.

It is preferable that m in the formula (1) and m' in the formula (1') are the same integer, since the composition of the present embodiment is excellent in film formability.

The content of the secondary fluorinated alcohol in the composition of the present embodiment is 0.01% by mass to 0.75% by mass with respect to the total content of the primary fluorinated alcohol and the secondary fluorinated alcohol, and since a light emitting device produced by using the composition of the present embodiment is excellent in luminance life, preferably 0.01% by mass to 0.45% by mass, more preferably 0.01% by mass to 0.30% by mass, further preferably 0.01% by mass to 0.25% by mass. When the content of the secondary fluorinated alcohol is less than 0.01% by mass or over 0.75% by mass with respect to the total content of the primary fluorinated alcohol and the secondary fluorinated alcohol, the luminance life of a light emitting device produced by using the composition becomes shorter.

In the formula (6) and the formula (7), n, na, nb, m1, ma and mb preferably satisfy n=na+nb, more preferably satisfy n=na+nb and m1=ma+mb, further preferably satisfy n=na+nb+1, particularly preferably satisfy n=na+nb+1 and m1=ma+mb, since the composition of the present embodiment is excellent is film formability.

[Electron Injectable Compound or Electron Transportable Compound]

The electron injectable compound or the electron transportable compound preferably has a group represented by any of the formula (2) to the formula (4), more preferably has a group represented by the formula (2), further preferably has a group represented by —COO$^-$Cs$^+$.

The alkali metal cation represented by M$^+$ includes, for example, Li$^+$, Na$^+$, K$^+$, Rb$^+$ and Cs$^+$, preferably K$^+$, Rb$^+$ or Cs$^+$, more preferably Cs$^+$.

The alkaline earth metal cation represented by M$^+$ includes, for example, Be$^{2+}$, Mg$^{2+}$, Ca$^{2+}$, Sr$^{2+}$ and Ba$^{2+}$, preferably Mg$^{2+}$, Ca$^{2+}$, Sr$^{2+}$ or Ba$^{2+}$, more preferably Ba$^{2+}$.

M$^+$ is preferably an alkali metal cation or an alkaline earth metal cation, more preferably an alkali metal cation.

The electron transportable compound or the electron injectable compound preferably has a constitutional unit represented by the formula (5). The compound having a constitutional unit represented by the formula (5) is usually a polymer compound.

In the formula (5), ni is preferably 1 or 2.

In the formula (5), the aromatic hydrocarbon group represented by Ar is preferably a group obtained by removing from a 1,4-phenylene group, a 1,3-phenylene group, a 1,2-phenylene group, a 2,6-naphthalenediyl group, a 1,4-naphthalenediyl group, a 2,7-fluorenediyl group, a 3,6-fluorenediyl group or a 2,7-phenanthreneddyl group ni hydrogen atoms bonding directly to atoms constituting the ring, more preferably a group obtained by removing from a 2,7-fluorenediyl group or a 3,6-fluorenediyl group ni hydrogen atoms bonding directly to atoms constituting the ring.

In the formula (5), the heterocyclic group represented by Ar is preferably a group obtained by removing from a 2,7-carbazolediyl group ni hydrogen atoms bonding directly to atoms constituting the ring, preferably a group obtained by removing from a 2,7-fluorenediyl group or a 3,6-fluorenediyl group ni hydrogen atoms bonding directly to atoms constituting the ring.

In the formula (5), Ar is preferably an aromatic hydrocarbon group.

The substituent other than Ri which Ar optionally has includes, for example, a halogen atom, a cyano group, an alkyl group, a cycloalkyl group, an aryl group, a monovalent heterocyclic group, an alkoxy group, a cycloalkoxy group, an aryloxy group, an amino group, a substituted amino group, an alkenyl group, a cycloalkenyl group, an alkynyl group, a cycloalkynyl group, a carboxyl group and a group represented by the formula (I-2), preferably an alkyl group.

$$—O—(C_{n''}H_{2n''}O)_{nx}—C_{m''}H_{2m''+1} \quad (I\text{-}2)$$

[wherein, n'', m'' and nx each independently represent an integer of 1 to 10.]

n'' is preferably an integer of 1 to 6, more preferably 2 or 3.

m'' is preferably an integer of 1 to 6, more preferably 1 or 2.

nx is preferably an integer of 1 to 6, more preferably an integer of 2 to 4.

In the formula (I-1), R is preferably a hydrocarbon group or a heterocyclic group, more preferably an aromatic hydrocarbon group or an aromatic heterocyclic group, further preferably an aromatic hydrocarbon group.

The substituent which R optionally has includes an alkyl group, a cycloalkyl group, an aryl group, a monovalent heterocyclic group and a group represented by the formula (I-2), preferably a group represented by the formula (I-2).

In the formula (I-1), Q is preferably an alkylene group, an arylene group or an oxygen atom, more preferably an alkylene group or an oxygen atom.

In the formula (I-1), Y is preferably a group represented by the formula (2), more preferably a group represented by —COO$^-$Cs$^+$.

The group represented by the formula (I-1) includes, for example, groups represented by the following formulae.

[Chemical Formula 14]

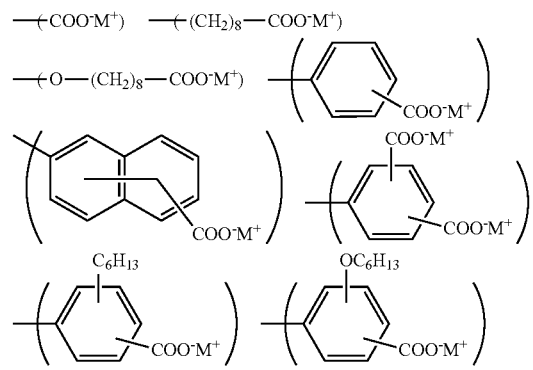

[Chemical Formula 15]

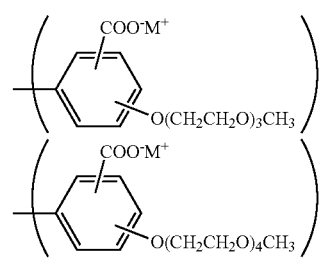

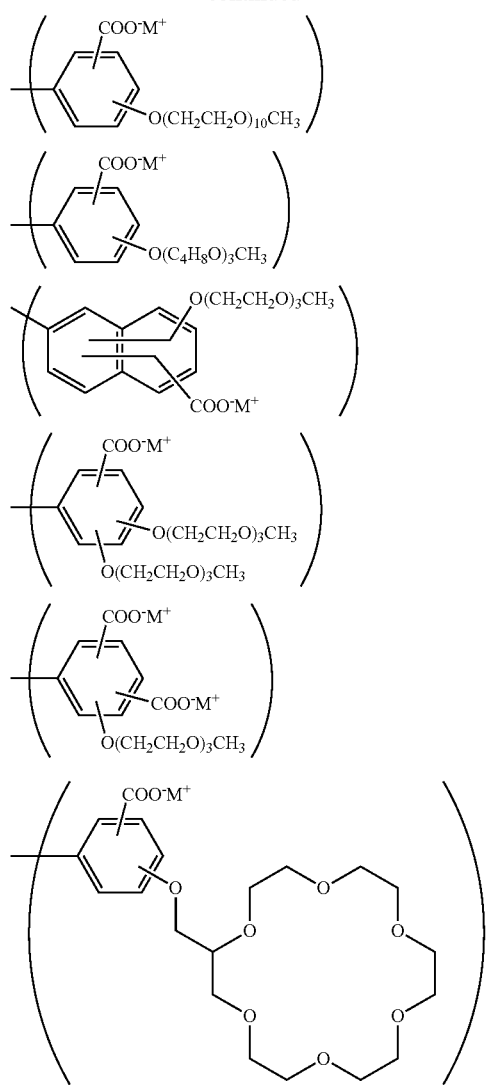

[wherein, $M^+$ represents the same meaning as described above. When a plurality of $M^+$ are present, they may be the same or different.]

The constitutional unit represented by the formula (5) includes, for example, constitutional units represented by the formula (ET-31) to the formula (ET-38), preferably a constitutional unit represented by the formula (ET-31) or the formula (ET-33).

[Chemical Formula 16]

(ET-31)

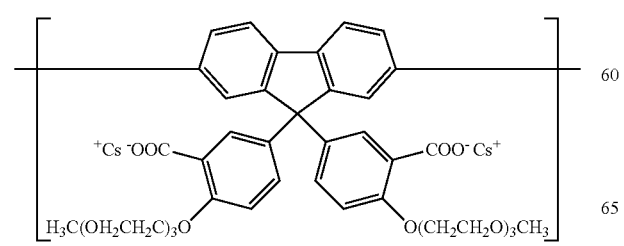

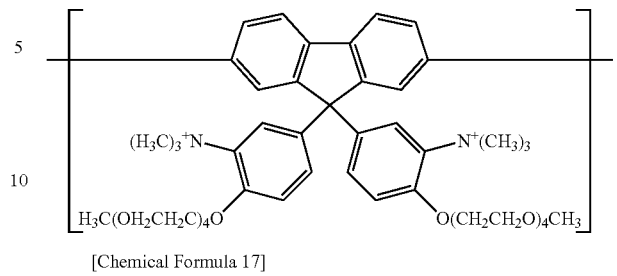

(ET-32)

[Chemical Formula 17]

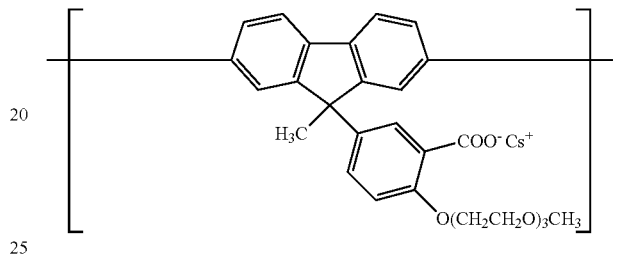

(ET-33)

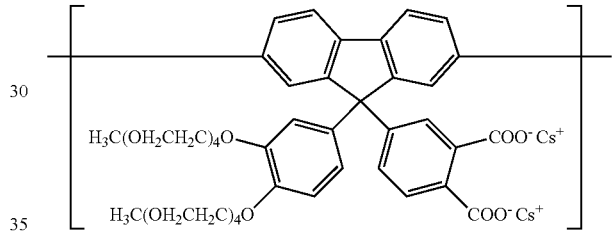

(ET-34)

[Chemical Formula 18]

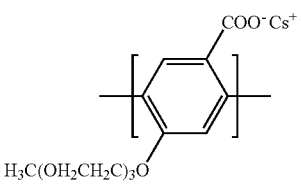

(ET-35)

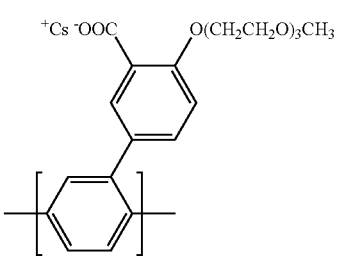

(ET-36)

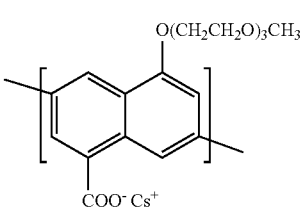

(ET-37)

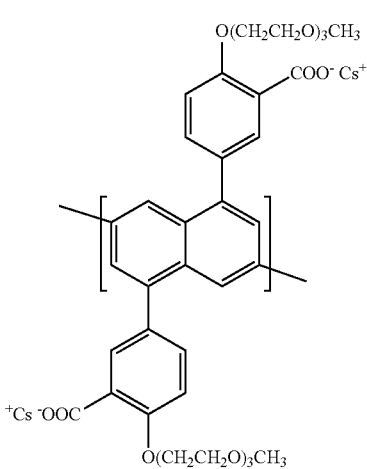

(ET-38)

The electron transportable compound or the electron injectable compound may be used alone or in combination of two or more.

The electron transportable compound or the electron injectable compound may be a polymer compound or a low molecular compound.

When the electron transportable compound or the electron injectable compound is a polymer compound, the polymer compound can be synthesized in accordance with methods described, for example, in Unexamined Japanese Patent Application Publication (JP-A) No. 2009-239279, JP-A No. 2012-033845, JP-A No. 2012-216821, JP-A No. 2012-216822 and JP-A No. 2012-216815.

When the electron transportable compound or the electron injectable compound is a low molecular compound, the low molecular compound is preferably a compound represented by the formula (H-1).

[Chemical Formula 19]

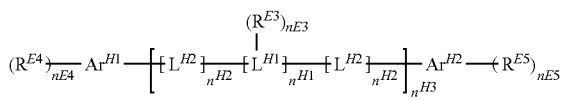

(H-1)

[wherein, $n^{H3}$ represents an integer of 0 or more.

$n^{H1}$ represents 0 or 1. When a plurality of $n^{H1}$ are present, they may be the same or different.

$n^{H2}$ represents 0 or 1. A plurality of $n^{H2}$ may be the same or different.

$L^{H1}$ represents a group obtained by removing nE3 hydrogen atoms from an arylene group or a divalent heterocyclic group, a group represented by —[C($R^{H11}$)$_2$]$n^{H11}$- or a group represented by —[P(=O)($R^{H12}$)]$n^{H12}$-, and these groups optionally have a substituent other than $R^{E3}$. When a plurality of $L^{H1}$ are present, they may be the same or different.

$n^{H11}$ and $n^{H12}$ each independently represent an integer of 1 to 10. $R^{H11}$ and $R^{H12}$ each independently represent a hydrogen atom, an alkyl group, a cycloalkyl group, an alkoxy group, a cycloalkoxy group, an aryl group or a monovalent heterocyclic group, and these groups optionally have a substituent. A plurality of $R^{H11}$ may be the same or different and may be combined together to form a ring together with carbon atoms to which they are attached. A plurality of $R^{H12}$ may be the same or different and may be combined together to form a ring together with carbon atoms to which they are attached.

nE3 represents an integer of 0 or more. nE3 represents 0 when $L^{H1}$ represents a group represented by —[C($R^{H11}$)$_2$]$n^{H11}$- or a group represented by —[P(=O)($R^{H12}$)]$n^{H12}$. When a plurality of nE3 are present, they may be the same or different.

$R^{E3}$ represents a group represented by the formula (I-1) described above. When a plurality of $R^{E3}$ are present, they may be the same or different.

$L^{H2}$ represents a group represented by —N(-$L^{H21}$-$R^{H21}$)—. When a plurality of $L^{H2}$ are present, they may be the same or different.

$L^{H21}$ represents a single bond, an arylene group or a divalent heterocyclic group, and these groups optionally have a substituent. $R^{H21}$ represents a hydrogen atom, an alkyl group, a cycloalkyl group, an aryl group or a monovalent heterocyclic group, and these groups optionally have a substituent.

$Ar^{H1}$ represents a group obtained by removing nE4 hydrogen atoms from an aryl group or a monovalent heterocyclic group, and these groups optionally have a substituent other than $R^{E4}$.

$Ar^{H2}$ represents a group obtained by removing nE5 hydrogen atoms from an aryl group or a monovalent heterocyclic group, and these groups optionally have a substituent other than $R^{E5}$.

nE4 and nE5 each independently represent an integer of 0 or more.

$R^{E4}$ and $R^{E5}$ each independently represent a group represented by the formula (I-1) described above. A plurality of $R^{E4}$ may be the same or different. A plurality of $R^{E5}$ may be the same or different.]

$n^{H3}$ is usually an integer of 0 to 10, preferably an integer of 0 to 5, more preferably an integer of 1 to 3, further preferably 1.

$n^{H1}$ is preferably 1.

$n^{H2}$ is preferably 0.

$n^{H11}$ is preferably an integer of 1 to 5, more preferably an integer of 1 to 3, further preferably 1.

$n^{H12}$ is preferably an integer of 1 to 5, more preferably an integer of 1 to 3, further preferably 1.

$L^{H1}$ is preferably a group obtained by removing nE3 hydrogen atoms from an arylene group or a divalent heterocyclic group from the standpoint of charge transportability, and preferably a group represented by —[P(=O)($R^{H12}$)]$n^{H12}$- from the standpoint of solubility in a fluorinated alcohol.

When $L^{H1}$ is a group obtained by removing nE3 hydrogen atoms from an arylene group or a divalent heterocyclic group, $L^{H1}$ is preferably a group obtained by removing nE3 hydrogen atoms from a group represented by the formula (A-1) to the formula (A-3), the formula (A-8) to the formula (A-10), the formula (AA-1) to the formula (AA-6), the formula (AA-10) to the formula (AA-21) or the formula (AA-24) to the formula (AA-38), more preferably a group obtained by removing nE3 hydrogen atoms from a group represented by the formula (A-1), the formula (A-2), the formula (AA-2), the formula (AA-4) or the formula (AA-14).

The substituent which $L^{H1}$ optionally has is a halogen atom, an alkyl group, a cycloalkyl group, an alkoxy group, a cycloalkoxy group, an aryl group or a monovalent heterocyclic group, more preferably an alkyl group, an aryl group or a monovalent heterocyclic group, and these groups optionally further have a substituent.

$L^{H21}$ is preferably a single bond or an arylene group, more preferably a single bond, and this arylene group optionally has a substituent.

The arylene group or the divalent heterocyclic group represented by $L^{H21}$ is preferably a group represented by the formula (A-1) to the formula (A-3), the formula (A-8) to the formula (A-10), the formula (AA-1) to the formula (AA-6), the formula (AA-10) to the formula (AA-21) or the formula (AA-24) to the formula (AA-38), more preferably a group represented by the formula (A-1), the formula (A-2), the formula (AA-2), the formula (AA-4) or the formula (AA-14).

$R^{H21}$ is preferably an aryl group or a monovalent heterocyclic group, and these groups optionally have a substituent.

The aryl group or the monovalent heterocyclic group represented by $R^{H21}$ is preferably a phenyl group, a spirobifluorenyl group, a pyridyl group, a pyrimidinyl group, a triazinyl group, a dibenzothienyl group, a dibenzofuryl group, a carbazolyl group or an azacarbazolyl group, more preferably a phenyl group, a pyridyl group, a carbazolyl group or an azacarbazolyl group.

The substituent which $R^{H21}$ optionally has is preferably an alkyl group, a cycloalkoxy group, an alkoxy group or a cycloalkoxy group, an alkyl group or a cycloalkoxy group, and these groups optionally further have a substituent.

The group obtained by removing nE4 hydrogen atoms from an aryl group or a monovalent heterocyclic group represented by $Ar^{H1}$ is preferably a group obtained by removing nE4 hydrogen atoms from a phenyl group, a spirobifluorenyl group, a pyridyl group, a pyrimidinyl group, a triazinyl group, a dibenzothienyl group, a dibenzofuryl group, a carbazolyl group or an azacarbazolyl group, more preferably a group obtained by removing nE4 hydrogen atoms from a phenyl group, a pyridyl group, a carbazolyl group or an azacarbazolyl group.

The group obtained by removing nE5 hydrogen atoms from an aryl group or a monovalent heterocyclic group represented by $Ar^{H2}$ is preferably a group obtained by removing nE5 hydrogen atoms from a phenyl group, a spirobifluorenyl group, a pyridyl group, a pyrimidinyl group, a triazinyl group, a dibenzothienyl group, a dibenzofuryl group, a carbazolyl group or an azacarbazolyl group, more preferably a group obtained by removing nE5 hydrogen atoms from a phenyl group, a pyridyl group, a carbazolyl group or an azacarbazolyl group.

The definitions and examples of the substituent which $Ar^{H1}$ and $Ar^{H2}$ optionally have are the same as the definitions and examples of the substituent which $R^{H21}$ optionally has.

The compound represented by the formula (H-1) includes, for example, compounds represented by the formula (H-101) to the formula (H-124).

[Chemical Formula 20]

(H-101)

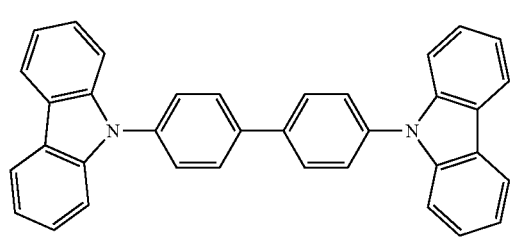

-continued (H-102)

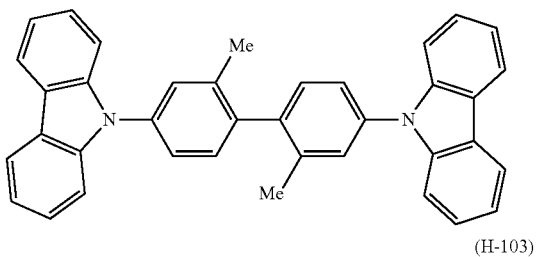

(H-103)

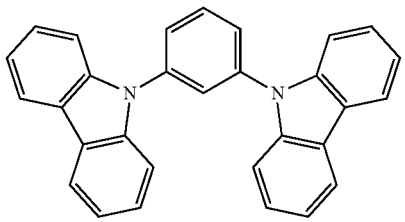

(H-104)

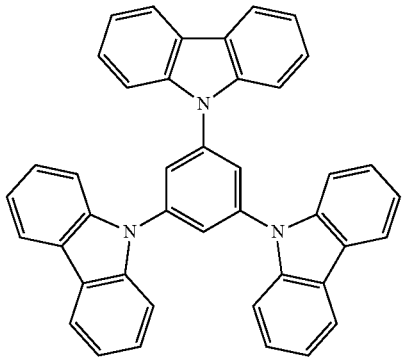

(H-105)

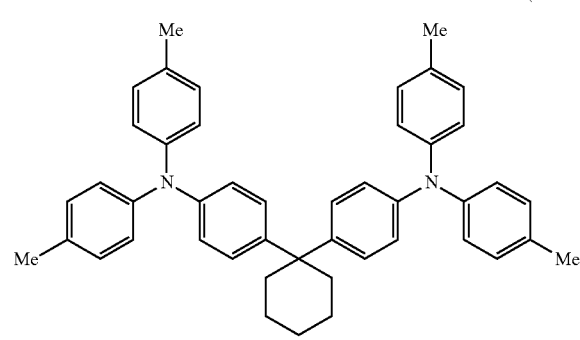

(H-106)

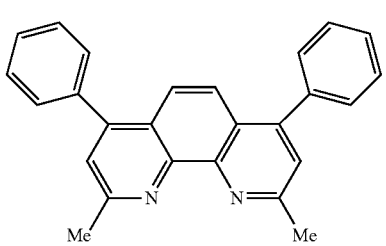

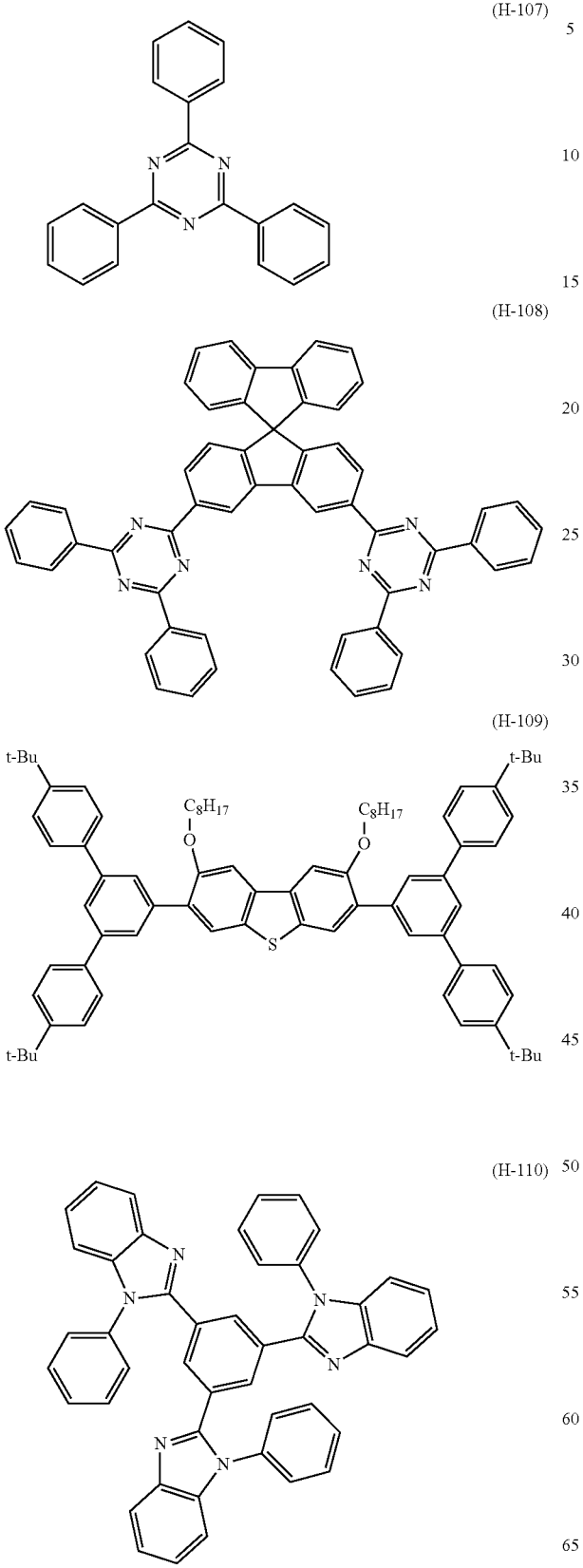
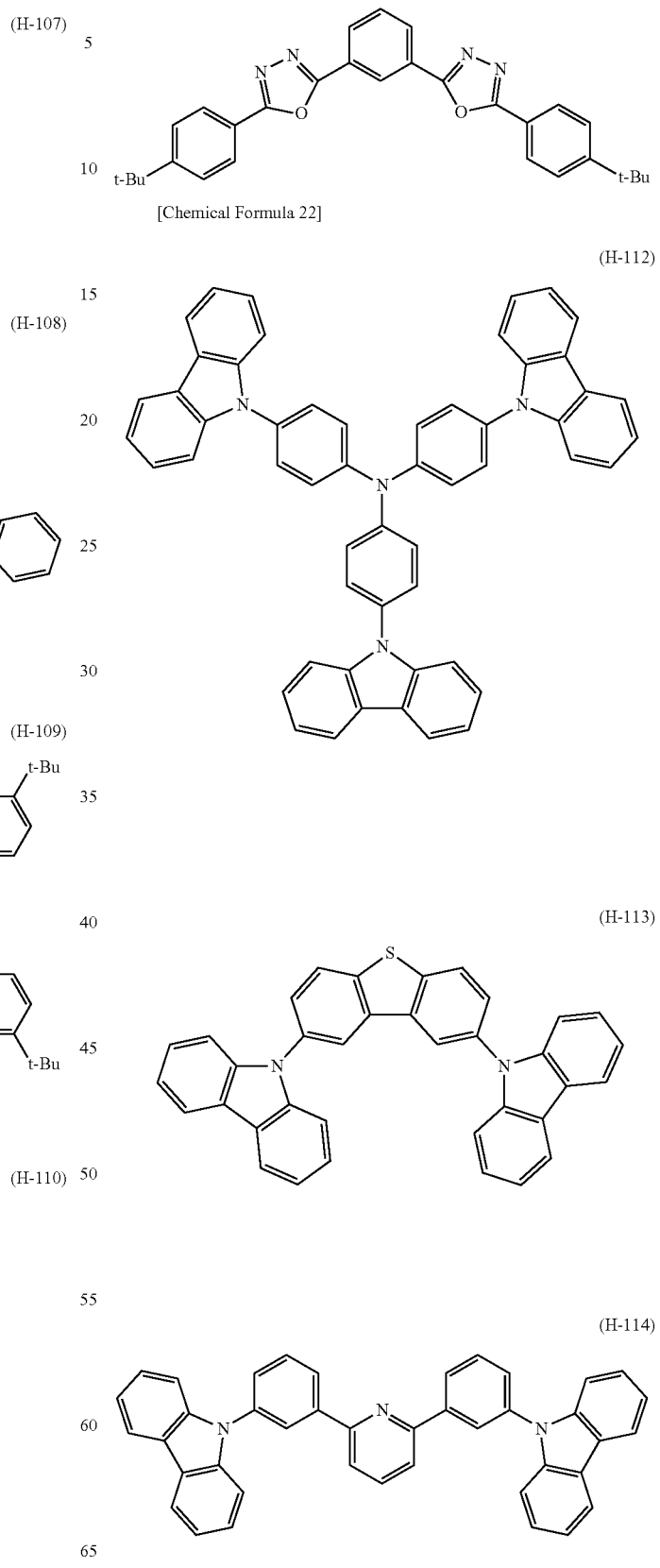

[Chemical Formula 23]
(H-112)
(H-115)
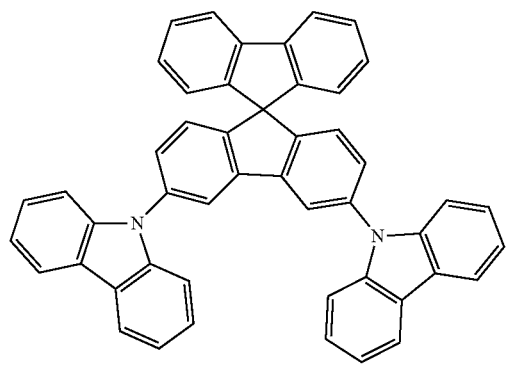
(H-116)
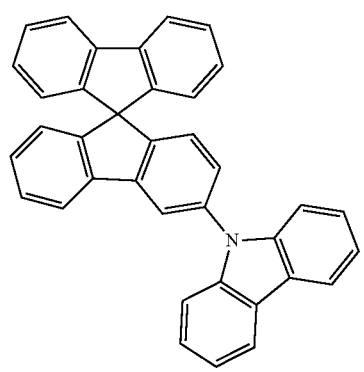
(H-117)
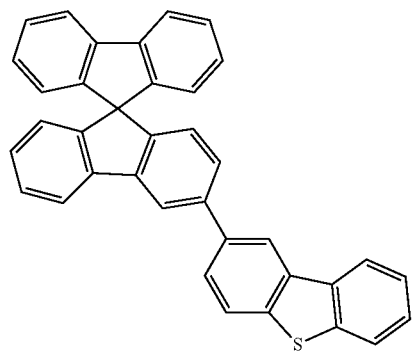
(H-118)
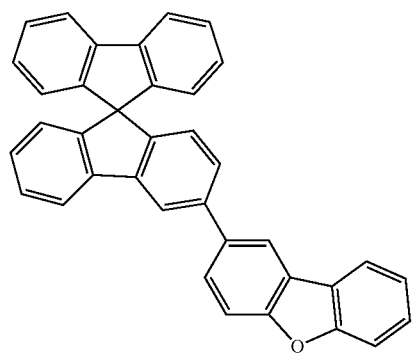
[Chemical Formula 24]
(H-119)
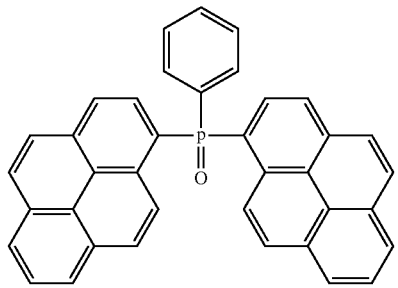
(H-120)
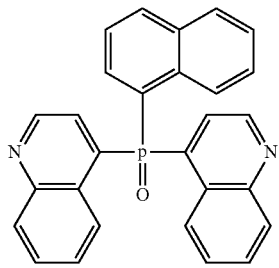
(H-121)
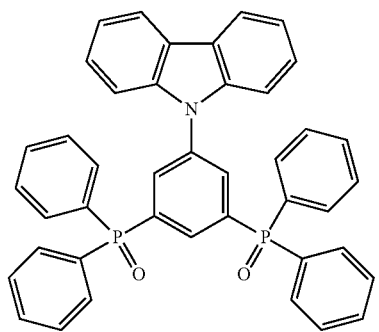
[Chemical Formula 25]
(H-122)
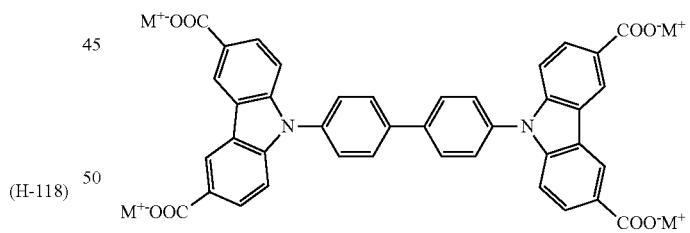
(H-123)
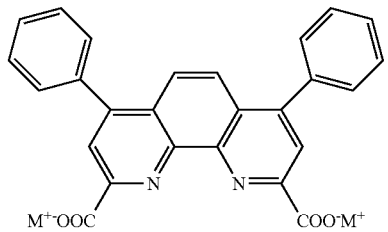

-continued (H-124)

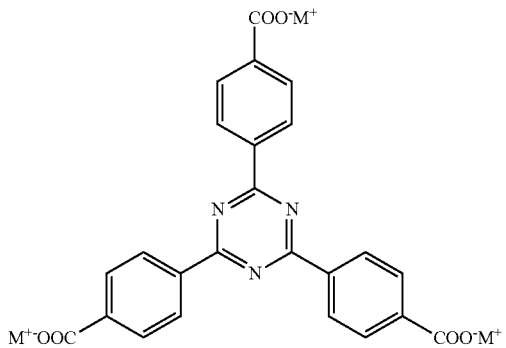

[wherein, M⁺ represents the same meaning as described above. When a plurality of M⁺ are present, they may be the same or different.]

In the composition of the present embodiment, the content of an electron injectable compound or an electron transportable compound is each usually 0.01 to 3 parts by mass, preferably 0.05 to 1 part by mass, more preferably 0.4 to 0.8 parts by mass, when the whole composition is taken as 100 parts by mass.

[Other Components]

The composition of the present embodiment may further comprises a light emitting material, a hole transporting material, a hole injection material, an antioxidant, an organic solvent and the like.

<Preparation Method of Composition>

The composition of the present embodiment can be prepared, for example, by dissolving an electron transportable compound or an electron injectable compound in a fluorinated alcohol mixed solvent in which the content of a secondary fluorinated alcohol is 0.01% by mass to 0.75% by mass with respect to the total content of a primary fluorinated alcohol and a secondary fluorinated alcohol.

<Light Emitting Device>

The composition of the present embodiment is useful for production of a light emitting device excellent in luminance life. The light emitting device of the present embodiment is a light emitting device obtained by using the composition of the present embodiment.

The light emitting device of the present embodiment usually has an anode, a cathode, a light emitting layer and a layer formed by using the composition of the present embodiment.

In the light emitting device of the present embodiment, the layer formed by using the composition of the present embodiment is preferably at least one layer selected from the group consisting of an electron injection layer and an electron transporting layer. The light emitting device of the present embodiment may further have a layer having another function such as a hole transporting layer, a hole injection layer, a protective layer, a buffer layer, a reflection layer and a sealing layer (sealing film, sealing substrate, etc.) and the like.

In the light emitting device of the present embodiment, the method of forming each layer includes, for example, a vacuum vapor-deposition method from a powder and a method by film formation from solution or melted state when a low molecular compound is used, and includes, for example, a method by film formation from solution or melted state when a polymer compound is used. Of them, the method of forming each layer is preferably a method by film formation from a solution. The order, number and thickness of layers to be laminated may be adjusted in view of light emission efficiency and device life.

The method of film formation from a solution includes, for example, application methods such as a spin coat method, a casting method, a micro gravure printing method, a gravure printing method, a bar coat method, a roll coat method, a wire bar coat method, a dip coat method, a slit coat method, a cap coat method, a spray coat method, a screen printing method, a flexo printing method, an offset printing method, an inkjet printing method, a nozzle coat method and the like.

The light emitting device of the present embodiment can be produced, for example, by sequentially laminating each layer on a substrate.

[Substrate]

The substrate which the light emitting device of the present embodiment can have is one that does not chemically change in forming an electrode and an organic layer, and preferably a substrate such as, for example, glass, plastic, polymer film, metal film, silicon and the like, and may also be a substrate obtained by laminating these.

[Hole Transporting Layer, Hole Injection Layer]

The hole transporting layer and the hole injection layer can be formed, for example, by using one or two or more hole transportable compounds and hole injectable compounds, respectively, and contain one or two or more hole transportable compounds and hole injectable compounds.

The hole transporting layer and the hole injection layer each has a thickness of, for example, 1 nm to 1 μm.

[Hole Transportable Compound and Hole Injectable Compound]

As the hole transportable compound and the hole injectable compound, known compounds can be used, and examples thereof include carbazole and derivatives thereof, triazole and derivatives thereof, oxazole and derivatives thereof, oxadiazole and derivatives thereof, imidazole and derivatives thereof, fluorene and derivatives thereof, pyrazoline and derivatives thereof, pyrazolone and derivatives thereof, phenylenediamine and derivatives thereof, arylamine and derivatives thereof, star-burst type amine, phthalocyanine and derivatives thereof, amino-substituted chalcon and derivatives thereof, styrylanthracene and derivatives thereof, fluorenone and derivatives thereof, hydrazone and derivatives thereof, stilbene and derivatives thereof, silazane and derivatives thereof, aromatic tertiary amine compounds, styrylamine compounds, aromatic dimethylidyne compounds, porphyrin compounds, organosilane compounds, and polymers containing them;

conductive metal oxides such as vanadium oxide, tantalum oxide, tungsten oxide, molybdenum oxide, ruthenium oxide, aluminum oxide and the like;

conductive polymers and oligomers such as polyaniline, aniline-based copolymers, thiophene oligomers, polythiophene and the like;

organic conductive materials such as poly(3,4-ethylenedioxythiophene)-polystyrenesulfonic acid, polypyrrole and the like;

amorphous carbon;

accepting organic compounds such as tatracyanoquinodimethane and derivatives thereof (for example, 2,3,5,6-tetrafluoro-7,7,8,8-tetracyanoquinodimethane), 1,4-naphthoquinone and derivatives thereof, diphenoquinone and derivatives thereof, polynitro compounds and the like;

silane coupling agents such as octadecyltrimethoxysilane and the like;

aromatic amine-based polymer compounds.

[Light Emitting Layer]

The light emitting layer can be formed by using a light emitting material, and contains a light emitting material. The light emitting materials are classified into low molecular compounds and polymer compounds.

The light emitting layer has a thickness of, for example, 5 nm to 1 μm.

The low molecular compound includes, for example, naphthalene and derivatives thereof, anthracene and derivatives thereof, perylene and derivatives thereof, and triplet light emitting complexes such as metal complexes having iridium, platinum or europium as the central metal and having phenylpyridine, phenylimidazole, phenyltriazole, phenylquinoline, phenanthroline, acetylacetone, porphyrin or the like as the ligand. These low molecular compounds optionally have a crosslinking group.

The polymer compound includes, for example, polymer compounds containing a phenylene group, a naphthalenediyl group, a fluorenediyl group, a phenanthrenediyl group, a dihydrophenanthrenediyl group, a carbazolediyl group, a phenoxazinediyl group, a phenothiazinediyl group, an anthracenediyl group, a pyrenediyl group and the like, polyarylenes having an aromatic amine structure in the side chain or the main chain, and derivatives thereof. These polymer compounds optionally have a crosslinking group.

The light emitting material contains preferably a triplet light emitting complex and a polymer compound.

The light emitting material may be used alone or in combination of two or more.

The light emitting layer may contain a host material together with a light emitting material. The host materials are classified into low molecular compounds and polymer compounds.

The low molecular compound used in the host material includes, for example, low molecular compounds described above as the hole transportable compound and the hole injectable compound and low molecular compounds described above as the electron transportable compound and the electron injectable compound, preferably compounds having a carbazole structure, compounds having a triarylamine structure, compounds having a phenanthroline structure, compounds having a triaryltriazine structure, compounds having an azole structure, compounds having a benzothiophene structure, compounds having a benzofuran structure, compounds having a fluorene structure and compounds having a spirofluorene structure.

The low molecular compound used in the host material includes, for example, compounds represented by the following formulae.

[Chemical Formula 26]

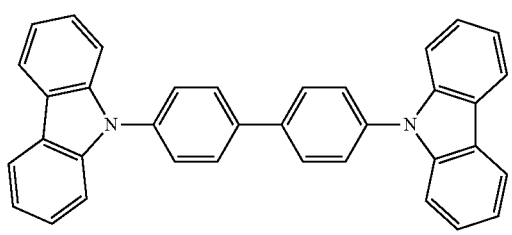

-continued

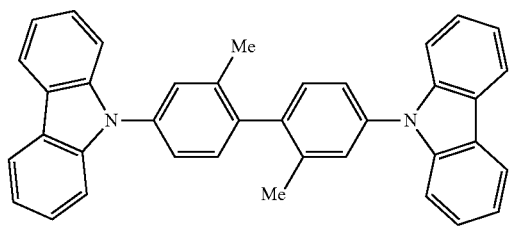

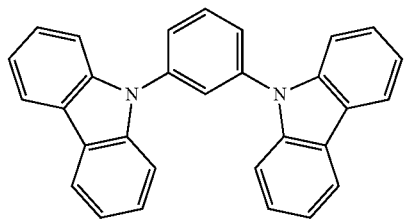

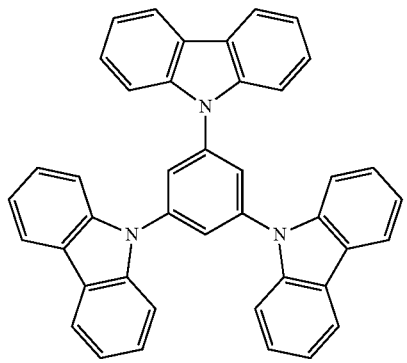

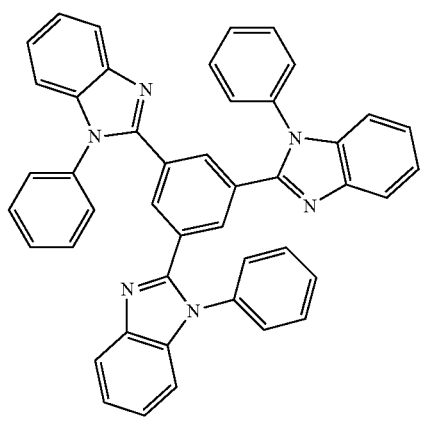

[Chemical Formula 27]

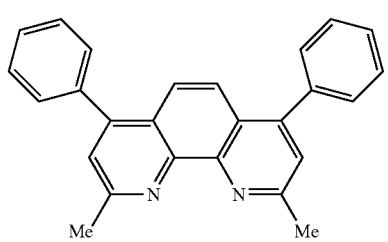

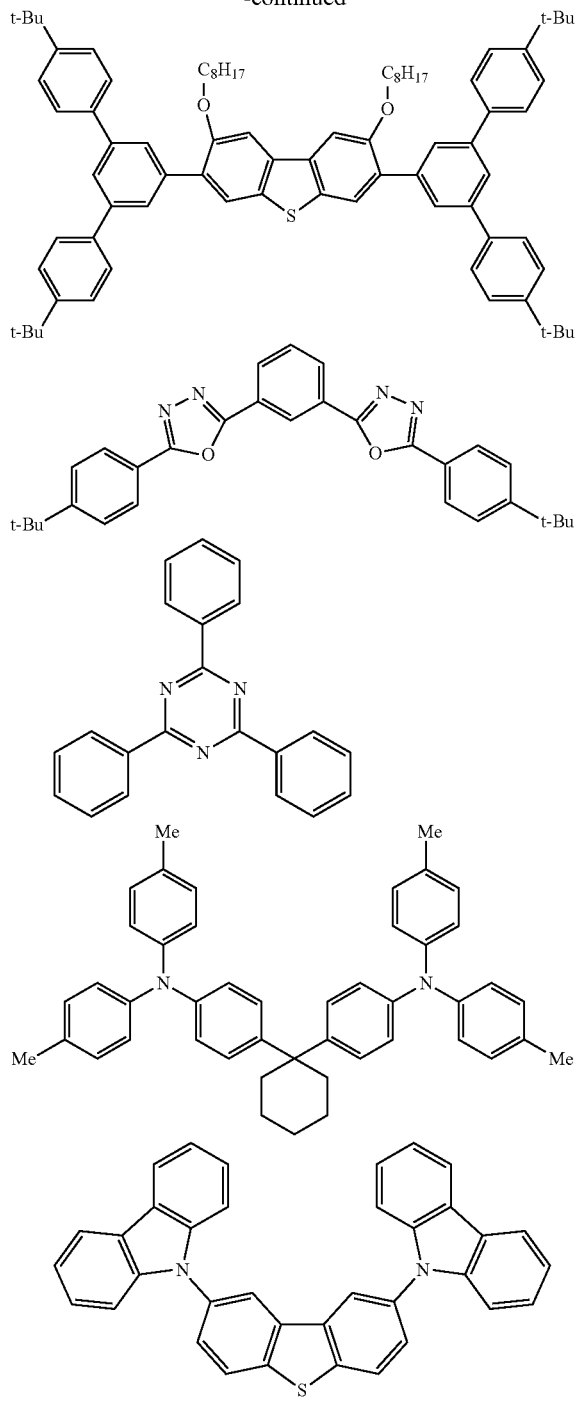

The polymer compound used in the host material includes, for example, polymer compounds described above as the hole transportable compound and the hole injectable compound, and polymer compounds described above as the electron transportable compound and the electron injectable compound.

[Electron Transporting Layer, Electron Injection Layer]

The electron transporting layer and the electron injection layer each can be formed, for example, by using one or two or more electron transportable compounds and electron injectable compounds described above, and contain one or two or more electron transportable compounds and electron injectable compounds described above.

The electron transporting layer and the electron transporting layer each has a thickness of, for example, 1 nm to 1 μm.

[Anode]

The material of the anode may be, for example, an electrically conductive metal oxide or a semi-transparent metal, and is, preferably, indium oxide, zinc oxide, tin oxide; an electrically conductive compound such as indium-tin-oxide (ITC), indium-zinc-oxide or the like; argentine-palladium-copper composite (APC); NESA, gold, platinum, silver or copper.

As the method for fabricating the anode, known methods can be used, and examples thereof include a vacuum vapor-deposition method, a sputtering method, an ion plating method, a plating method, a method by film formation from a solution (a mixed solution with a polymer binder may also be used), and the like.

The anode has a thickness of, for example, 10 nm to 10 μm.

[Cathode]

The material of the cathode includes, for example, metals such as lithium, sodium, potassium, rubidium, cesium, beryllium, magnesium, calcium, strontium, barium, aluminum, zinc, indium and the like; alloys composed of two or more of them; alloys composed of one or more of them and one or more of silver, copper, manganese, titanium, cobalt, nickel, tungsten and tin; and graphite and graphite intercalation compounds.

As the method for fabricating the cathode, known methods can be used, and exemplified are a vacuum vapor-deposition method, a sputtering method, an ion plating method and a method by film formation from a solution (a mixed solution with a polymer binder may also be used). When the cathode is composed of metal nano particles, metal nano wires or electrically conductive metal oxide nano particles, a method by film formation from a solution is used.

The cathode has a thickness of, for example, 1 to 1000 nm.

EXAMPLES

The present invention will be illustrated in detail by examples below, but the present invention is not limited to these examples.

In examples, the polystyrene-equivalent number-average molecular weight (Mn) and polystyrene-equivalent weight-average molecular weight (Mw) of a polymer compound were determined according to any of measurement conditions of size exclusion chromatography (SEC) described below using tetrahydrofuran as a mobile phase.

<Measurement Condition 1>

A polymer compound to be measured was dissolved in tetrahydrofuran at a concentration of about 0.05% by mass, and 10 μL of the resultant solution was injected into SEC. The mobile phase was flowed at a flow rate of 2.0 mL/min. As a column, PLgel MIXED-B (manufactured by Polymer Laboratories, Ltd.) was used. As a detector, UV-VIS Detector (trade name: SPD-10Avp, manufactured by Shimadzu Corp.) was used.

<Measurement Condition 2>

A polymer compound to be measured was dissolved in tetrahydrofuran at a concentration of about 0.05% by mass, and 10 μL of the resultant solution was injected into SEC. The mobile phase was flowed at a flow rate of 1.0 mL/min. As a column, PLgel MIXED-B (manufactured by Polymer Laboratories, Ltd.) was used. As a detector, UV-VIS Detector (trade name: UV-8320GPC, manufactured by Tosoh Corp.) was used.

NMR was measured by the following method.

A measurement sample (5 to 10 mg) was dissolved in about 0.5 mL of heavy chloroform, heavy tetrahydrofuran, heavy dimethyl sulfoxide, heavy acetone, heavy N,N-dimethylformamide, heavy toluene, heavy methanol, heavy ethanol, heavy 2-propanol or heavy methylene chloride, and NMR thereof was measured using an NMR apparatus (trade name: INOVA300 or MERCURY400VX, manufactured by Agilent).

As an indicator of the purity of a compound, the value of high performance liquid chromatography (HPLC) area percentage was used. This value is a value at UV=254 nm in HPLC (trade name: LC-20A, manufactured by Shimadzu Corp.) unless otherwise stated. In this operation, a compound to be measured was dissolved in tetrahydrofuran or chloroform to a concentration of 0.01 to 0.2% by mass, and 1 to 10 µL of the solution was injected into HPLC depending on the concentration. As the mobile phase of HPLC, a mixture of acetonitrile/tetrahydrofuran was used while changing the ratio thereof from 100/0 to 0/100 (volume ratio) and flowed at a flow rate of 1.0 mL/min. As a column, Kaseisorb LC ODS 2000 (manufactured by Tokyo Chemical Industry Co., Ltd.) or an ODS column having the equivalent ability was used. As a detector, Photodiode Array Detector (trade name: SPD-M20A, manufactured by Shimadzu Corp.) was used.

[Synthesis Example 1] Synthesis of Monomers CM1 to CM4 and Polymer Compound 1

Monomers CM1 to CM4 were synthesized in accordance with methods described in the following documents and those showing an HPLC area percentage value of 99.5% or more were adopted.

The monomers CM1 to CM3 were synthesized in accordance with a method described in International Publication. WO2013/146806.

The monomer CM4 was synthesized in accordance with a method described in International Publication WO2009/157424.

[Chemical Formula 28]

Monomer CM1

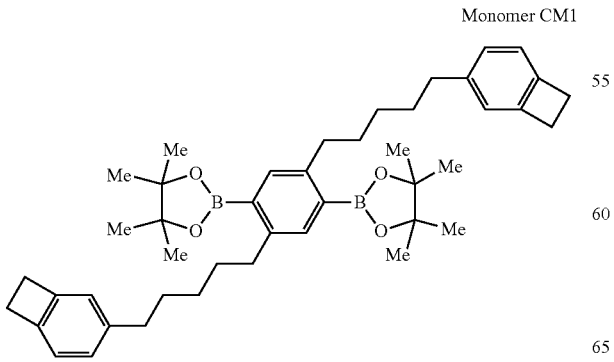

[Chemical Formula 29]

Monomer CM2

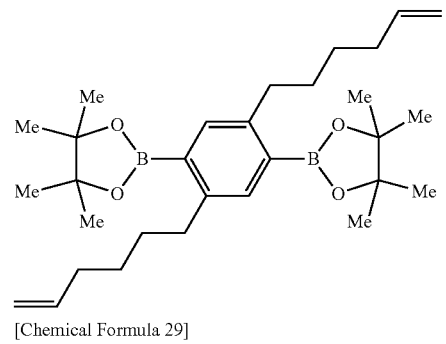

Monomer CM3

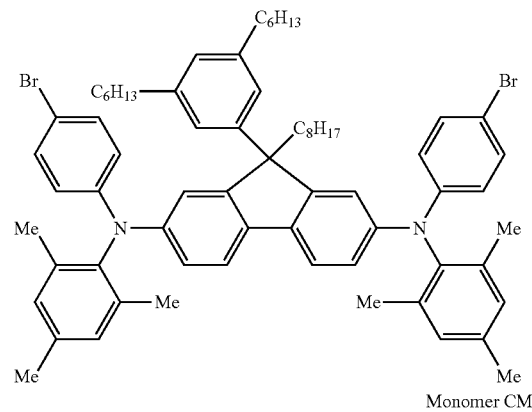

Monomer CM4

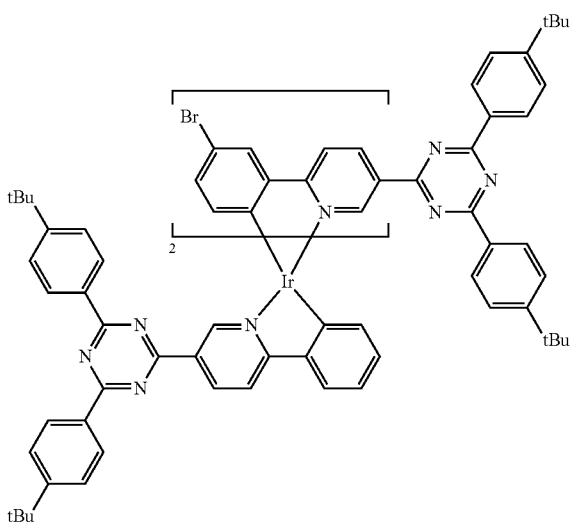

A polymer compound 1 is a polymer composed of a constitutional unit represented by the formula (A), and synthesized according to a method described in International Publication WO2012/011418. In this operation, a precursor of the polymer compound 1 was a polymer composed of a constitutional unit represented by the formula (B). Mw of the precursor of the polymer compound 1 measured under measurement condition 2 was $1.2 \times 10^5$.

[Chemical Formula 30]

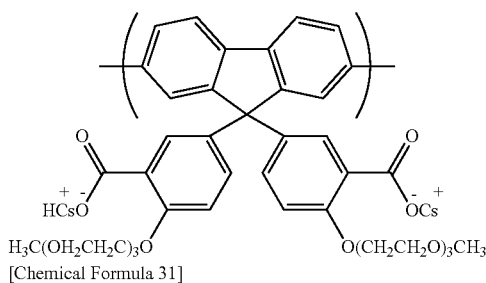

(A)

[Chemical Formula 31]

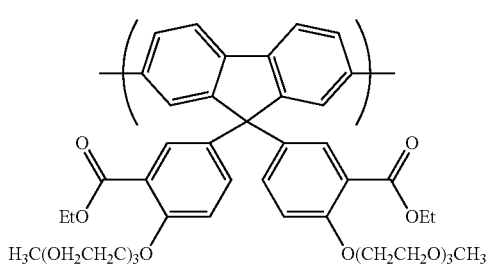

(B)

[Synthesis Example 2] Synthesis of Polymer Compound 2

An inert gas atmosphere was prepared is a reaction vessel, then, the monomer CM1 (2.52 g), the monomer CM2 (0.47 g), the monomer CM3 (4.90 g), the monomer CM4 (0.53 g) and toluene (158 mL) were added, and heated at 95° C. To the resultant reaction solution were added a 20% by mass tetraethylammonium hydroxide aqueous solution (16 mL) and dichlorobis(tris-o-methoxyphenylphosphine)palladium (4.2 mg), and the mixture was refluxed for 8 hours. After the reaction, to this were added phenylboronic acid (0.12 g), a 20% by mass tetraethylammonium hydroxide aqueous solution (16 mL) and dichlorobis(tris-o-methoxyphenylphosphine)palladium (4.2 mg), and the mixture was refluxed for 15 hours. After the reaction, to this was added a sodium diethyldithiacarbamate aqueous solution, and the mixture was stirred at 85° C. for 2 hours. The resultant reaction solution was cooled, then, washed with a 3.6% by mass hydrochloric acid aqueous solution twice, with a 2.5% by mass ammonia aqueous solution twice and with water four times, and the resultant solution was dropped into methanol, to generate a precipitate. The resultant precipitate was dissolved in toluene, and purified was passing through an alumina column and a silica gel column in this order. The resultant solution was dropped into methanol, the mixture was stirred, then, the resultant precipitate was filtrated and dried, to obtain a polymer compound 2 (6.02 g). Mn of the polymer compound 2 measured under measurement condition 1 was $3.8 \times 10^4$, and Mw thereof was $4.5 \times 10^5$.

The polymer compound 2 is a copolymer constituted of a constitutional unit derived from the monomer CM1, a constitutional unit derived from the monomer CM2, a constitutional unit derived from the monomer CM3 and a constitutional unit derived from the monomer CM4 at a molar ratio of 40:10:47:3, according to the theoretical values determined from the amounts of the charged raw materials.

[Synthesis Example 3] Synthesis of Phosphorescent Compounds 1 and 2

Phosphorescent compounds 1 and 2 were synthesized in accordance with methods described in the following documents and those showing an HPLC area percentage value of 99.5% or more were adopted.

The phosphorescent compound 1 was synthesized according to a method describe in International Publication WO2006/121811.

The phosphorescent compound 2 was synthesized in accordance with a method described in International Publication WO2009/131255.

[Chemical Formula 32]

Phosphorescent compound 1

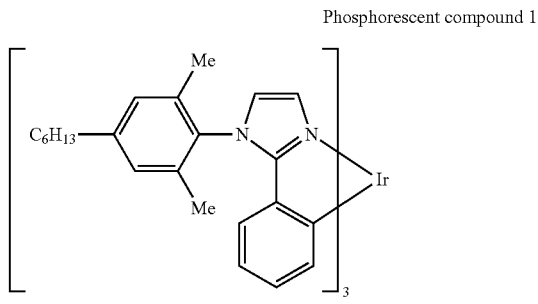

Phosphorescent compound 2

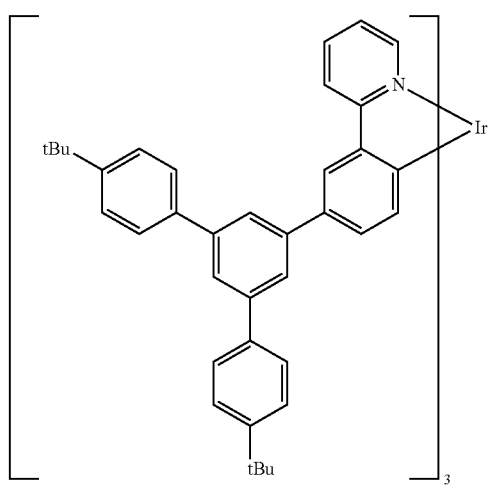

Example 1

Preparation of Composition

A mixture 1 of 1H,1H,5H-octafluoro-1-pentanol ($C_5H_3F_8OH$: which is a primary fluorinated alcohol, and hereinafter, written as "OFP-1") and 1H,3H,5H-octafluoro-3-pentanol (($C_5H_3F_8OH$: which is a secondary fluorinated alcohol, and hereinafter, written as "OFP-2") (the content of the secondary fluorinated alcohol is 0.01% by mass) was prepared. The polymer compound 1 was dissolved in the prepared mixture 1 to a concentration of 0.6% by mass, to obtain a composition 1.

(Fabrication of Light Emitting Device)

An ITO film was attached at a thickness of 45 nm to a glass substrate by a sputtering method. A hole injection material (ND-3202, manufactured by Nissan Chemical Industries, Ltd.) was spin-coated to form a film with a thickness of 35 nm on an anode, and, under an air atmosphere where ozone had been removed, the film was heated on a hot plate at 50° C. for 3 minutes, then, on a hot plate at 240° C. for 15 minutes, to form a hole injection layer.

The polymer compound 2 was dissolved in xylene to a concentration of 0.65% by mass. The resultant xylene solution was spin-coated to form a film with a thickness of 20 nm on the hole injection layer, and the film was heated on a hot plate at 180° C. for 60 minutes under a nitrogen gas atmosphere, to form a hole transporting layer.

A low molecular compound 1 represented by the following formula (LT-N4013, manufactured by LuminescenceTechnology), the phosphorescent compound 1 and the phosphorescent compound 2 (mass ratio: low molecular compound 1/phosphorescent compound 1/phosphorescent compound 2=74/25/1) were dissolved in toluene to a concentration of 2.0% by mass, to prepare a toluene solution. The prepared toluene solution was spin-coated to form a film with a thickness of 75 nm on the hole transporting layer, and heated on a hot plate at 130° C. for 10 minutes under a nitrogen gas atmosphere, to form a light emitting layer.

[Chemical Formula 33]

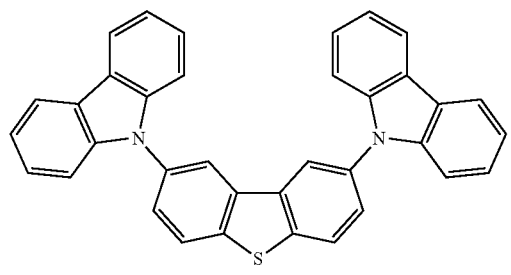

Low molecular compound 1

The composition 1 was spin-coated to form a film with a thickness of 40 nm on the light emitting layer, and the layer was heated on a hot plate at 130° C. for 10 minutes under a nitrogen gas atmosphere, to form an electron transporting layer.

The substrate carrying the electron transporting layer formed thereon was placed in a vapor deposition machine, and the inner pressure thereof was reduced to $1.0 \times 10^{-4}$ Pa or less, then, as a cathode, sodium fluoride was vapor-deposited with a thickness of about 4 nm on the electron transporting layer, then, aluminum was vapor deposited with a thickness of about 100 nm on the sodium fluoride layer. Thereafter, sealing was performed using a glass substrate, to fabricate a light emitting device D1.

For the light emitting device D1, the life with 30% reduced luminance (that is, the life until the luminance reaches 70% of the initial luminance) was measured with an initial luminance of 6000 cd/m². The results are shown in Table 1.

Examples 2 to 13 and Comparative Examples 1 to 15

Compositions were prepared, light emitting devices D2 to D13 and CD1 to CD15 were fabricated and the lives with 30% reduced luminance were measured in the same manner as in Example 1, except that mixtures shown in Table 1 were used instead of the mixture 1 in Example 1. In Table 1, "DFH-1" denotes 1H,1H,7H-decafluoro-1-heptanol ($C_7H_3F_{12}OH$: primary fluorinated alcohol), "DFH-2" denotes 1H,3H,7H-decafluoro-3-heptanol ($C_7H_3F_{12}OH$: secondary fluorinated alcohol), "TFP" denotes 1H,1H,3H-tetrafluoro-1-propanol ($C_3H_3F_4OH$: primary fluorinated alcohol) and "HFIP" denotes 2H-hexafluoro-2-propanol ($C_3H_1F_6OH$: secondary fluorinated alcohol). The results are shown in Table 1.

TABLE 1

| | light emitting device | fluorinated alcohol in mixture (% by mass) | | | | | | secondary fluorinated alcohol content (% by mass) | life with 30% reduced luminance (hr) |
| --- | --- | --- | --- | --- | --- | --- | --- | --- | --- |
| | | OFP-1 | OFP-2 | DFH-1 | DFH-2 | TFP | HFIP | | |
| Example 1 | D1 | 99.99 | 0.01 | — | — | — | — | 0.01 | 91.8 |
| Example 2 | D2 | 99.93 | 0.07 | — | — | — | — | 0.07 | 91.3 |
| Example 3 | D3 | 99.86 | 0.14 | — | — | — | — | 0.14 | 92.4 |
| Example 4 | D4 | 99.70 | 0.30 | — | — | — | — | 0.30 | 87.4 |
| Example 5 | D5 | 99.25 | 0.75 | — | — | — | — | 0.75 | 89.8 |
| Example 6 | D6 | — | — | 99.97 | 0.03 | — | — | 0.03 | 91.8 |
| Example 7 | D7 | — | — | 99.74 | 0.26 | — | — | 0.26 | 87.9 |
| Example 8 | D8 | 59.99 | 0.006 | 39.993 | 0.007 | — | — | 0.013 | 88.3 |
| Example 9 | D9 | 59.82 | 0.18 | 40.00 | — | — | — | 0.18 | 99.1 |
| Example 10 | D10 | 59.55 | 0.45 | 40.00 | — | — | — | 0.45 | 94.9 |
| Example 11 | D11 | — | — | — | — | 99. | 0.2 | 0.2 | 100.9 |
| Example 12 | D12 | 49.9 | 0.036 | — | — | 50 | — | 0.036 | 97.4 |
| Example 13 | D13 | 49.8 | 0.15 | 40 | — | 9.5 | 0.5 | 0.65 | 87.7 |
| Comparative Example 1 | CD1 | 100 | — | — | — | — | — | 0 | 81.6 |
| Comparative Example 2 | CD2 | 98.44 | 1.56 | — | — | — | — | 1.56 | 53.7 |
| Comparative Example 3 | CD3 | — | — | 99.993 | 0.007 | — | — | 0.007 | 85.4 |
| Comparative Example 4 | CD4 | — | — | 98.83 | 1.17 | — | — | 1.17 | 49.0 |
| Comparative Example 5 | CD5 | — | — | 96.52 | 3.48 | — | — | 3.48 | 4.9 |
| Comparative Example 6 | CD6 | — | — | 92.55 | 7.45 | — | — | 7.45 | 0.1 |
| Comparative Example 7 | CD7 | — | — | 100 | — | — | — | 0 | 76.2 |
| Comparative Example 8 | CD8 | 60.00 | — | 39.993 | 0.007 | — | — | 0.007 | 81.4 |

TABLE 1-continued

| | light emitting device | fluorinated alcohol in mixture (% by mass) | | | | | | secondary fluorinated alcohol content (% by mass) | life with 30% reduced luminance (hr) |
|---|---|---|---|---|---|---|---|---|---|
| | | OFP-1 | OFP-2 | DFH-1 | DFH-2 | TFP | HFIP | | |
| Comparative Example 9 | CD9 | 59.55 | 0.45 | 39.53 | 0.47 | — | — | 0.92 | 28.2 |
| Comparative Example 10 | CD10 | 59.07 | 0.93 | 38.61 | 1.39 | — | — | 2.32 | 12.0 |
| Comparative Example 11 | CD11 | 57.30 | 2.70 | 37.02 | 2.98 | — | — | 5.68 | 0.3 |
| Comparative Example 12 | CD12 | 9.99 | 0.007 | 50 | — | 40 | — | 0.007 | 80.3 |
| Comparative Example 13 | CD13 | 99.2 | 0.3 | — | — | — | 0.5 | 0.8 | 81.7 |
| Comparative Example 14 | CD14 | 59.8 | 0.18 | 39.2 | 0.1 | — | 0.7 | 0.98 | 31 |
| Comparative Example 15 | CD15 | — | — | 48.26 | 1.74 | 50 | — | 1.74 | 1.5 |

INDUSTRIAL APPLICABILITY

According to the present invention, a composition which is useful for production of a light emitting device excellent in luminance life and a light emitting device obtained by using the composition can be provided.

The invention claimed is:

1. A composition comprising a primary fluorinated alcohol represented by the formula (1), a secondary fluorinated alcohol represented by the formula (1') and an electron injectable compound or an electron transportable compound, wherein
the content of the secondary fluorinated alcohol is 0.01% by mass to 0.75% by mass with respect to the total content of the primary fluorinated alcohol and the secondary fluorinated alcohol:

$$C_nH_{2n-m+1}F_mOH \quad (1)$$

$$C_{n'}H_{2n'-m'+1}F_{m'}OH \quad (1')$$

in the formula (1),
n represents an integer of 1 to 10, and m is an integer satisfying $1 \leq m \leq 2n+1$, and
in the formula (1'),
n' represents an integer of 3 to 10, and m' is an integer satisfying $1 \leq m' \leq 2n'+1$.

2. The composition according to claim 1, wherein said n and said n' are each an integer of 4 to 8.

3. The composition according to claim 1, wherein said m is an integer satisfying $m=2n-2$ and said m' is an integer satisfying $m'=2n'-2$.

4. The composition according to claim 1, wherein said n and said n' are the same integer and said m and said m' are the same integer.

5. The composition according to claim 1, wherein said electron injectable compound or said electron transportable compound has a group represented by any of the formula (2) to the formula (4):

$$-COO^-M^+ \quad (2)$$

$$-SO_3^-M^+ \quad (3)$$

$$PO_3^{2-}M^+ \quad (4)$$

in the formulae (2) to (4),
$M^+$ represents an alkali metal cation, an alkaline earth metal cation or an ammonium cation, and the ammonium cation optionally has a substituent.

6. The composition according to claim 5, wherein said electron injectable compound or said electron transportable compound has a constitutional unit represented by the formula (5):

in the formula (5),
ni represents an integer of 1 to 4,
Ar represents an aromatic hydrocarbon group or a heterocyclic group, and these groups optionally have a substituent other than Ri, and when a plurality of the substituent other than Ri are present, they may be the same or different, and
$R_i$ represents a group represented by the formula (I-1), and when a plurality of $R_i$ are present, they may be the same or different, $$-R-\{(Q)_{n1}-Y\}_{n2} \quad (I\text{-}1)$$

in the formula (I-1),
n1 represents an integer of 0 to 4, and when a plurality of n1 are present, they may be the same or different,
n2 represents an integer of 1 to 4,
when n2=1, R represents a single bond, a hydrocarbon group, a heterocyclic group or —O—R'— wherein R' represents a hydrocarbon group or a heterocyclic group, and these groups optionally have a substituent, while when $2 \leq n2 \leq 4$, R represents a hydrocarbon group or a heterocyclic group, and these groups optionally have a substituent,
Q represents an alkylene group, a cycloalkylene group, an arylene group, an oxygen atom or a sulfur atom, and these groups optionally have a substituent, and when a plurality of Q are present, they may be the same or different, and Y represents a group represented by any of said formula (2) to said formula (4), and when a plurality of Y are present, they may be the same or different.

7. A light emitting device obtained by using the composition according to claim 1.

* * * * *